(12) United States Patent
Wu et al.

(10) Patent No.: US 12,148,733 B2
(45) Date of Patent: Nov. 19, 2024

(54) SHIFT CONTROL METHOD IN MANUFACTURE OF SEMICONDUCTOR DEVICE

(71) Applicant: Taiwan Semiconductor Manufacturing Company, Ltd., Hsinchu (TW)

(72) Inventors: Chih-Wei Wu, Yilan County (TW); Ying-Ching Shih, Hsinchu (TW); Hsien-Ju Tsou, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 365 days.

(21) Appl. No.: 17/530,481

(22) Filed: Nov. 19, 2021

(65) Prior Publication Data

US 2022/0077108 A1  Mar. 10, 2022

Related U.S. Application Data

(62) Division of application No. 16/572,628, filed on Sep. 17, 2019, now Pat. No. 11,183,482.

(51) Int. Cl.
| H01L 23/00 | (2006.01) |
| H01L 21/56 | (2006.01) |
| H01L 21/66 | (2006.01) |
| H01L 21/78 | (2006.01) |
| H01L 23/544 | (2006.01) |

(52) U.S. Cl.
CPC ............ *H01L 24/96* (2013.01); *H01L 21/561* (2013.01); *H01L 21/568* (2013.01); *H01L 21/78* (2013.01); *H01L 22/20* (2013.01); *H01L 22/26* (2013.01); *H01L 23/544* (2013.01); *H01L 22/12* (2013.01); *H01L 2223/54426* (2013.01); *H01L 2224/95001* (2013.01); *H01L 2224/95121* (2013.01)

(58) Field of Classification Search
CPC ......... H01L 22/20; H01L 22/26; H01L 22/12; H01L 24/96; H01L 24/19; H01L 24/20; H01L 21/561; H01L 21/568; H01L 21/78; H01L 21/6835; H01L 23/544; H01L 2223/54426; H01L 2224/95001; H01L 2224/95121; H01L 2221/68345; H01L 2221/68327; H01L 2221/68381
See application file for complete search history.

(56) References Cited

U.S. PATENT DOCUMENTS

| 8,179,536 | B2 * | 5/2012 | Huang ............... G03F 7/70633 |
| | | | 356/614 |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |

(Continued)

*Primary Examiner* — Michael M Trinh
(74) *Attorney, Agent, or Firm* — JCIPRNET

(57) ABSTRACT

A shift control method in manufacture of semiconductor device includes at least the following step. A plurality of semiconductor dies is encapsulated with an insulating encapsulation over a carrier, where at least portions of the plurality of semiconductor dies are shifted after encapsulating. A lithographic pattern is formed at least on the plurality of semiconductor die, where forming the lithographic pattern includes compensating for a shift in a position of the portions of the plurality of semiconductor dies.

20 Claims, 17 Drawing Sheets

(56) References Cited

U.S. PATENT DOCUMENTS

| | | | |
|---|---|---|---|
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,164,802 B2 * | 11/2021 | Kawai | H01L 22/20 |
| 2016/0086825 A1 * | 3/2016 | Scanlan | H01L 24/11 |
| | | | 438/15 |
| 2018/0082911 A1 * | 3/2018 | Bishop | H01L 24/19 |
| 2019/0115235 A1 * | 4/2019 | Ahn | H01L 21/67271 |

* cited by examiner

SHIFT CONTROL METHOD IN MANUFACTURE OF SEMICONDUCTOR DEVICE

CROSS-REFERENCE TO RELATED APPLICATION

This application is a divisional application of U.S. application Ser. No. 16/572,628, filed on Sep. 17, 2019. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed, for example, semiconductor dies are encapsulated in an insulating material, and a redistribution layer (RDL) is formed on the insulating material to fan out wiring for contact pads of the semiconductor dies, so that electrical contact is made on a larger pitch than contact pads of semiconductor dies.

However, these relatively new types of packaging for semiconductors face manufacturing challenges, for example, when semiconductor dies are positioned on carrier wafers and an insulating material is formed to cover the semiconductor dies, undesirable movement of the semiconductor dies can occur and may cause problems aligning subsequently formed material layers of RDL. Accordingly, such die movement in package formation results in reduced yields.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
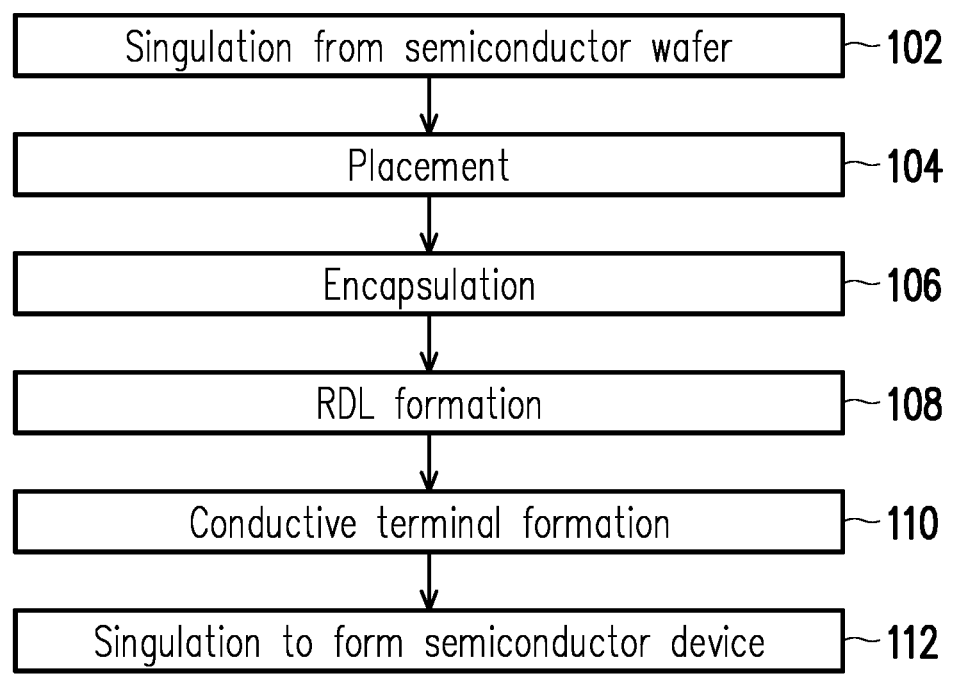
FIG. 1 is a flow diagram illustrating a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
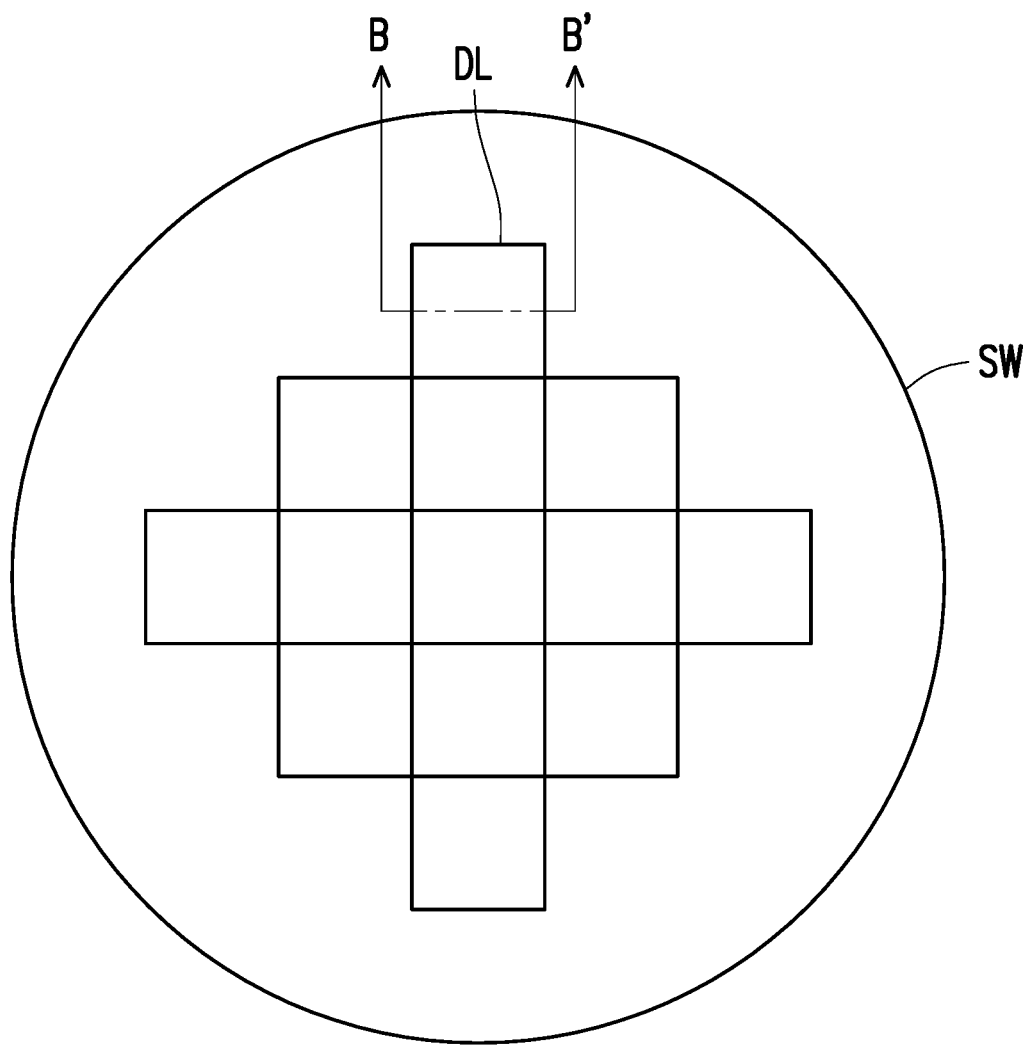
FIG. 2 is a schematic top view illustrating a semiconductor wafer before singulation according to some embodiments of the present disclosure.
Figure 3:
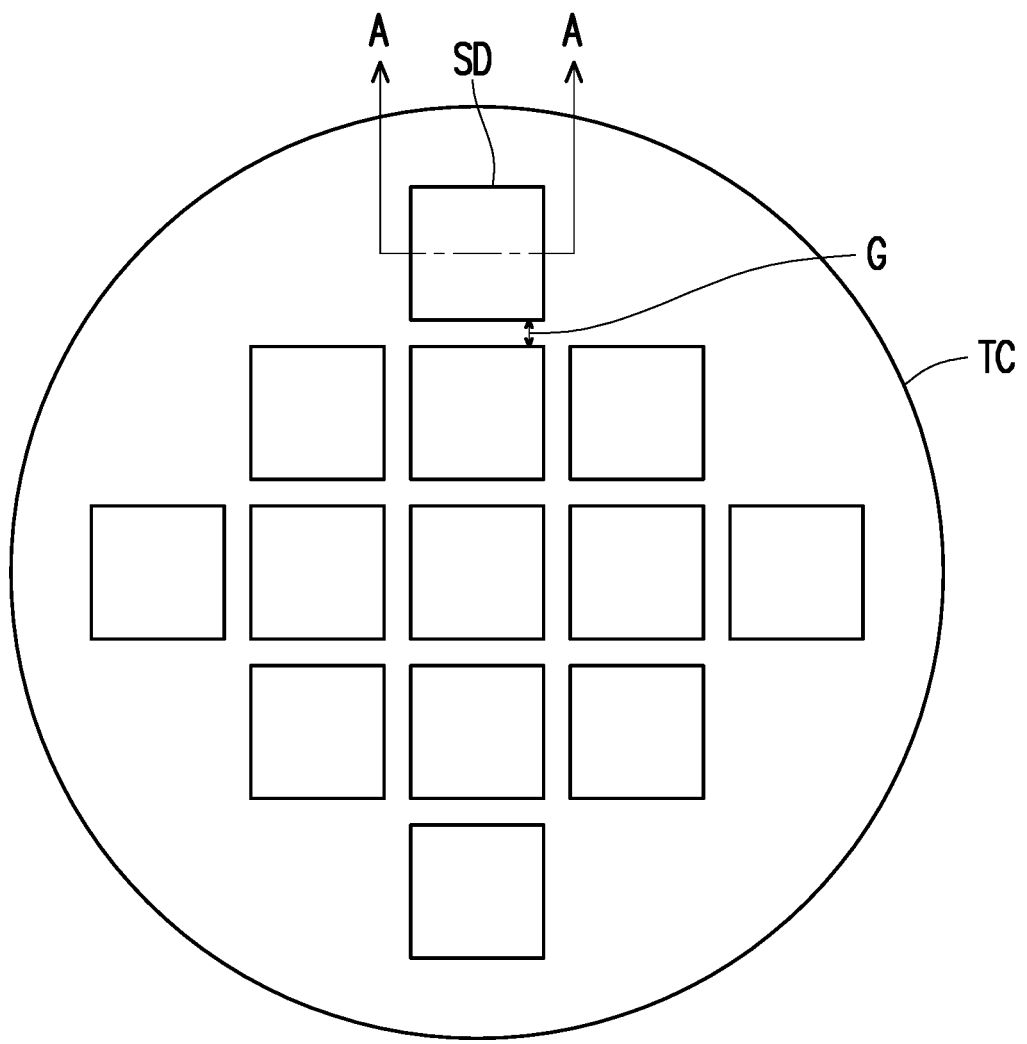
FIG. 3 is a schematic top view illustrating a plurality of semiconductor dies placed on a carrier according to some embodiments of the present disclosure.

FIG. 1 is a flow diagram illustrating a manufacturing method of a semiconductor device; FIG. 2 is a schematic top view illustrating a semiconductor wafer before singulation; FIG. 3 is a schematic top view illustrating a plurality of semiconductor dies placed on a carrier; and FIGS. 4A-4F are schematic cross-sectional views of various stages of manufacturing a semiconductor device, where FIGS. 4A-4F may be the schematic cross-sectional views taken along line A-A' in FIG. 3. The semiconductor device and the method of making the same are collectively described with reference to FIG. 1 through FIG. 4F.

Referring to FIG. 1 and FIG. 2, the method 100 begins at step 102 by singulating a semiconductor wafer SW to form a plurality of semiconductor dies SD. In some embodiments, the semiconductor wafer SW is processed to completion of all levels including front-end-of-line (FEOL) layers and back-end-of-line (BEOL) layers. For example, a plurality of die areas DL is arranged across the semiconductor wafer SW in columns and rows. Each die area DL is a part of the same semiconductor wafer SW and may include a variety of integrated circuit components that have been manufactured. The integrated circuit components may include transistors, capacitors, resistors, combinations of these, or other suitable component which may be used to generate the structural and functional requirements of the design for the semiconductor dies SD. In some embodiments, the semiconductor dies SD are of a single size though each die area DL may include different designs or products. It should be noted that the size, shape, and design of the semiconductor die SD may be different one from another and the semiconductor dies SD may not have to be arranged in columns and in rows.

In some embodiments, the semiconductor wafer SW is attached to a tape frame (not shown) which holds the semiconductor wafer SW in place during the singulation process. Subsequently, a cutting or singulation process may be performed on the semiconductor wafer SW. For example, a mechanical saw, laser saw, or other suitable tool is used to cut across the semiconductor wafer SW along scribe lines (e.g., a series of horizontal lines and vertical lines), so that several semiconductor dies SD are separated, or singulated, from each other.

Figure 4A:
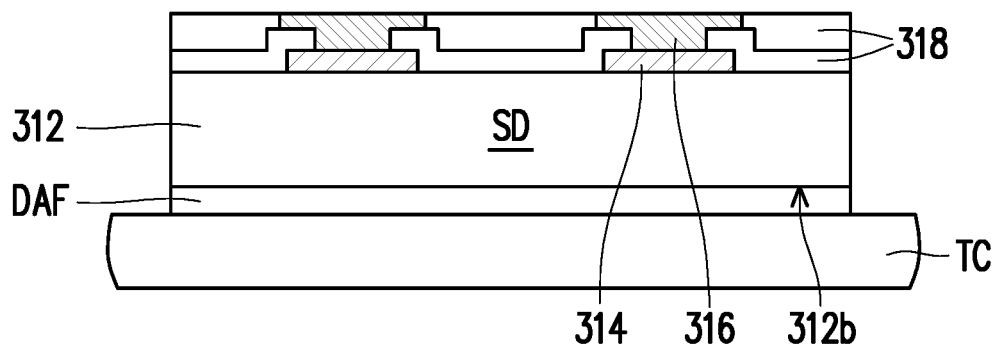
FIG. 4A to FIG. 4F are schematic cross-sectional views of various stages of manufacturing a semiconductor device according to some embodiments of the present disclosure.

Referring to FIGS. 1, 3, and 4A, the method 100 proceeds to step 104 by placing the semiconductor dies SD on a temporary carrier TC. The temporary carrier TC may include any suitable material that could provide structural support during semiconductor processing. For example, the temporary carrier TC includes metal (e.g., steel), glass, ceramic, silicon (e.g., bulk silicon), combinations thereof, multi-layers thereof, or the like. A release layer (not shown) is optionally formed on the temporary carrier TC for bonding and de-bonding the temporary carrier TC from the structure subsequently formed thereon. For example, the release layer includes a layer of light-to-heat-conversion (LTHC) release coating and a layer of associated adhesive (such as a ultra-violet (UV) curable adhesive or a heat curable adhesive layer), or the like.

For example, the semiconductor dies SD are separately disposed on the temporary carrier TC by a pick-and-place process. In some embodiments, the rear surface 312b of the semiconductor die SD is attached to the temporary carrier TC through a die attach film DAF. The semiconductor die SD may be provided with the die attach film DAF attached to the rear surface 312b of the semiconductor die SD before the pick-and-place process. Alternatively, the die attach film DAF is omitted. In some embodiments, the semiconductor dies SD are spatially apart from one another, and the gaps G are formed between adjacent semiconductor dies SD. In some embodiments, no die attach film DAF exists in the gaps G.

For example, the semiconductor die SD includes digital die, analog die or mixed signal die, such as application-specific integrated circuit (ASIC) die, logic die, sensor die, but is not limited thereto. Note that, as shown in FIGS. 4A-4F, only one semiconductor die SD is presented for illustrative purposes; however, the number of the semiconductor die SD may be one or more than one, the disclosure is not limited thereto. In certain embodiments, additional semiconductor die(s) singulated from another semiconductor wafer may be provided and placed on the temporary carrier TC, and the additional semiconductor die and the semiconductor die SD may be the same type or different types.

In some embodiments, the respective semiconductor die SD includes a semiconductor substrate 312, a plurality of conductive pads 314 disposed on the semiconductor substrate 312, a plurality of conductive connectors 316 disposed on the respective conductive pads 314, and a protection layer 318 partially covering the conductive connectors 316 and the conductive pads 314. In one embodiment, the semiconductor substrate 312 is a silicon substrate including active components (e.g., diodes, transistors or the like) and passive components (e.g., resistors, capacitors, inductors or the like) formed therein. In one embodiment, the conductive pads 314 are made of aluminum or alloys thereof, or the like. The conductive pads 314 may be electrically coupled to the active/passive components formed in the semiconductor substrate 312 via an interconnection structure (not shown) disposed between the semiconductor substrate 312 and the conductive pads 314, and the conductive connectors 316 may be electrically connected to the conductive pads 314 in order to provide external connections to the integrated circuit components formed in the semiconductor substrate 312. In some embodiments, the surface where the conductive connectors 316 are distributed on is referred to as an active surface of the semiconductor die SD.

In one embodiment, the conductive connectors 316 include copper vias, copper alloy vias, or other suitable metal vias. In some embodiments, the conductive connectors 316 include lead-based materials, or lead-free materials with/without additional impurity formed on the top, which is not limited thereto. In some embodiments, the protection layer 318 is formed on the semiconductor substrate 312 for preventing any possible damage(s) occurring on the conductive connector 316. In some embodiments, the protection layer 318 includes a passivation sublayer having openings for accessibly exposing at least a portion of conductive connectors 316. The protection layer 318 may be made of a polybenzoxazole (PBO) layer, a polyimide (PI) layer, or suitable polymers or inorganic materials. In an embodiment, top surfaces of the conductive connectors 316 are substantially level with a top surface of the protection layer 318. The numbers of the conductive pads 314 and the conductive connectors 316 may be selected based on demand, which is not limited in the disclosure. It should be noted that the illustration of semiconductor die SD and other component(s) throughout all figures is schematic and is not in scale.

Figure 4B:
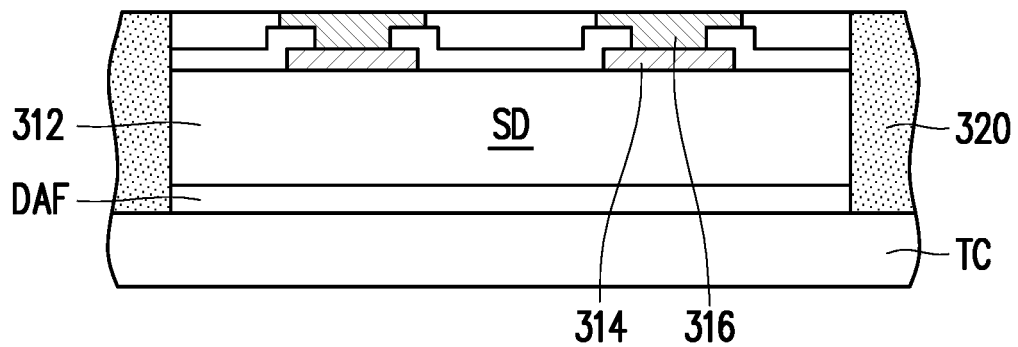

Referring to FIG. 1 and FIG. 4B, the method 100 proceeds to step 106 by encapsulating the semiconductor dies SD with an insulating encapsulation 320. The insulating encapsulation 320 includes a molding compound, epoxy resin, silica filler, and/or resists materials, as examples, although other materials may be used for the insulating encapsulation 320. The insulating encapsulation 320 may fill into the gaps G between the adjacent semiconductor dies SD. For example, the formation of the insulating encapsulant 320 includes: forming an insulating material (not shown) by over-molding to encapsulate the semiconductor dies SD, where a curing process may be performed to solidify the insulating material; and planarizing the insulating material until at least the conductive connectors 316 are accessibly exposed for external connections, where the planarization may include grinding, chemical-mechanical polishing (CMP), etching, or the like. In some embodiments, after planarization, there may not be insulating encapsulation 320 over semiconductor dies SD. In a top view of the structure, the semiconductor dies SD is laterally covered and encircled by the insulating encapsulation 320. In some embodiments, the top surface of the insulating encapsulation 320 is substantially level with the top surface of the semiconductor die SD as shown in FIG. 4B.

Figure 4C:
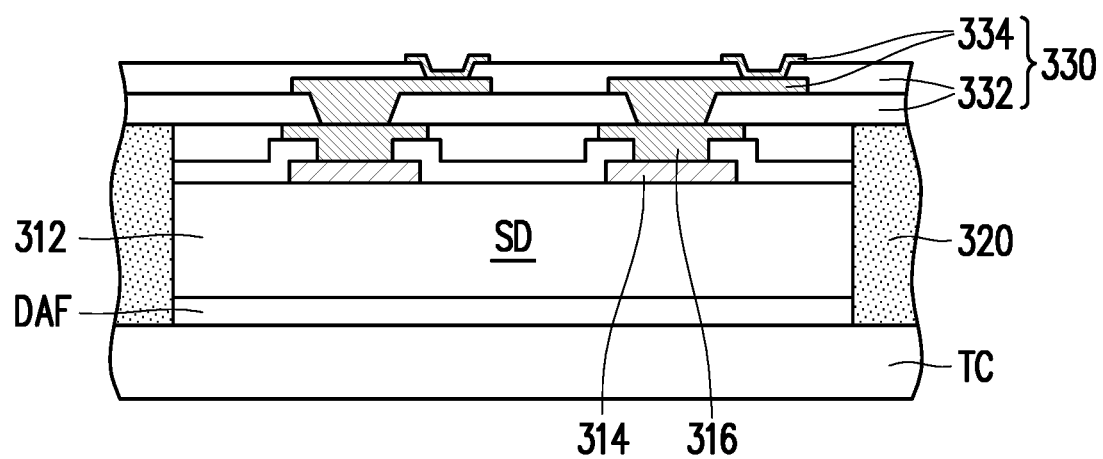

Referring to FIG. 1 and FIG. 4C, the method 100 proceeds to step 108 by forming a redistribution layer (RDL) 330 on the semiconductor dies SD and the insulating encapsulation 320. For example, the RDL 330 includes at least one patterned dielectric layer and at least one patterned conductive layer alternating stacked on one another. In an exemplary embodiment, the formation of the RDL 330 at least includes the following steps. For example, a patterned dielectric layer 332 having openings is formed on the semiconductor dies SD and the insulating encapsulation 320 by using deposition, lithography, etching, and/or other suitable methods. The conductive connectors 316 of the semiconductor die SD may be at least partially exposed by the openings of the patterned dielectric layer 332. The material of the patterned dielectric layer 332 may include polyimide (PI), polybenzoxazole (PBO), benzocyclobutene (BCB), or other suitable electrical insulating materials. Next, a patterned conductive layer 334 is formed on the patterned dielectric layer 332 using plating, sputtering, lithography, etching, and/or other suitable methods. The material of patterned conductive layer 334 may include copper, tungsten, aluminum, silver, gold, the like, or a combination thereof. For example, a via portion of the patterned conductive layer 334 is formed in the openings of the patterned dielectric layer 332 to be in physical and electrical contact with the underlying conductive connectors 316 of the semiconductor die SD. A portion of the patterned conductive layer 334 extending on the surface of the patterned dielectric layer 332 may reroute the electrical signal of the semiconductor die SD to expand wider than a given area.

In some embodiments, the abovementioned steps may be performed multiple times to obtain a multi-layered redistribution structure as required by the circuit design. That is, the numbers of the patterned dielectric layer 332 and the patterned conductive layer 334 can be selected based on demand and are not limited in the disclosure. In other embodiments, the patterned conductive layer 334 is formed before forming the patterned dielectric layer 332. It should be noted that the forming sequence of the patterned dielectric layer 332 and the patterned conductive layer 334 depends on the design requirement and construe no limitation in the disclosure. In some embodiments, the topmost layer of the patterned conductive layer 334 includes a plurality of patterns for electrically connecting with the later-formed components. For example, the patterns include under-ball metallurgy (UBM) patterns for ball mount and/or connection pads for mounting of electronic components.

Figure 4D:
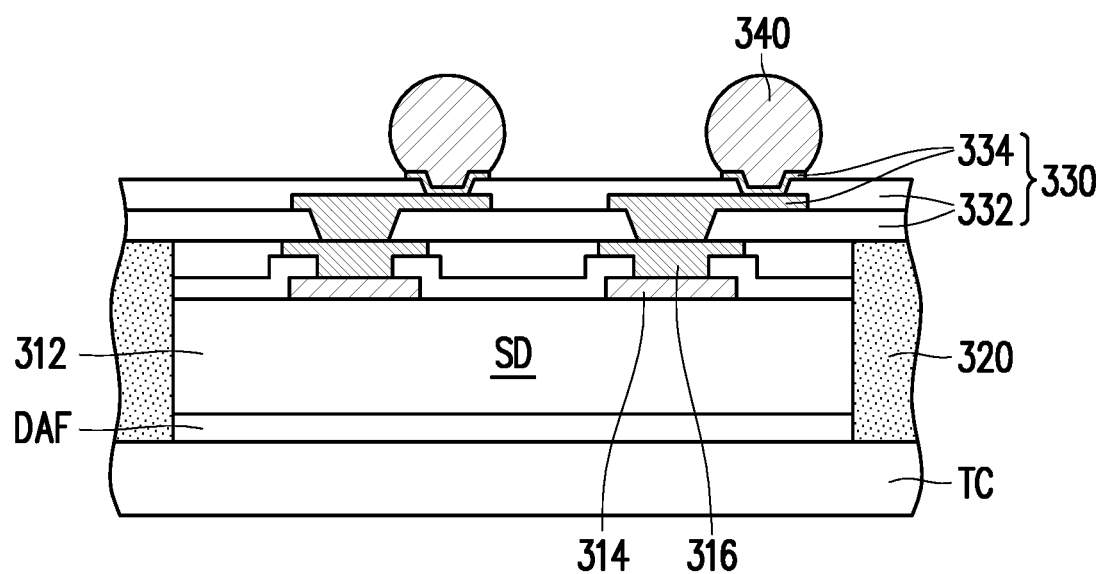

Referring to FIG. 1 and FIG. 4D, the method 100 proceeds to step 110 by forming conductive terminals 340 on the RDL 330. In some embodiments, the conductive terminals 340 are disposed on the UBM patterns of the patterned conductive layer 334 by a ball placement process, a plating process, or other suitable processes. For example, the conductive terminals 340 include C4 bumps, micro-bumps, solder balls, ball grid array (BGA) balls, or other suitable terminals for providing external connections to the semiconductor die SD. Other possible forms and shapes of the conductive terminals 340 may be utilized according to the design requirement. In some embodiments, a soldering process and a reflow process may be optionally performed for enhancement of the adhesion between the conductive terminals 340 and the RDL 330.

Figure 4E:
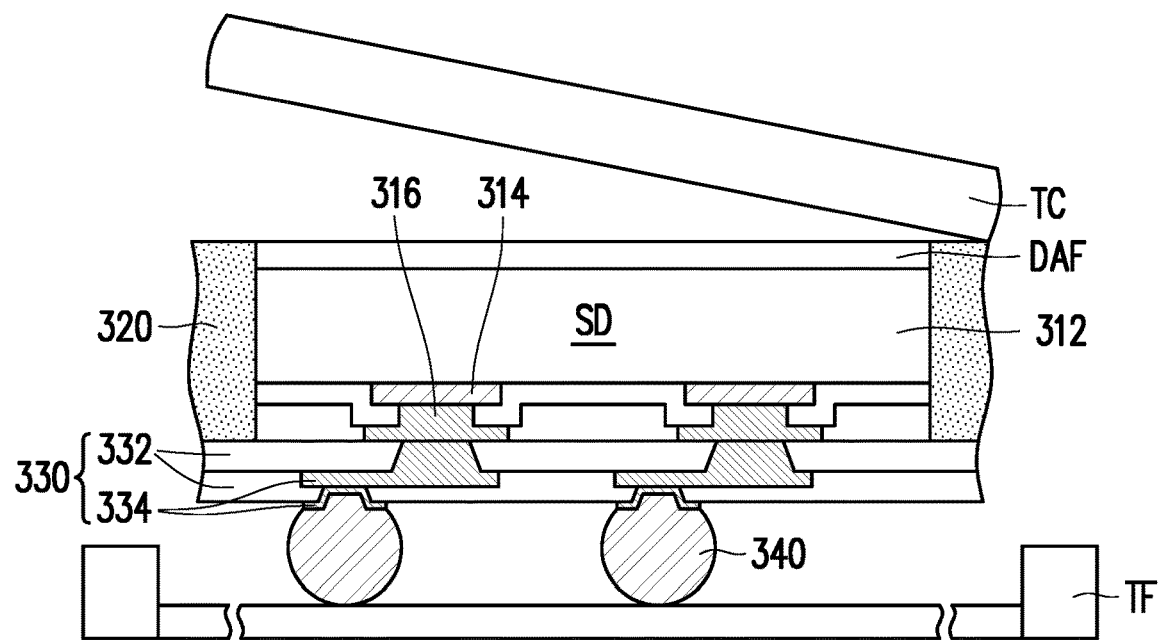
Figure 4F:
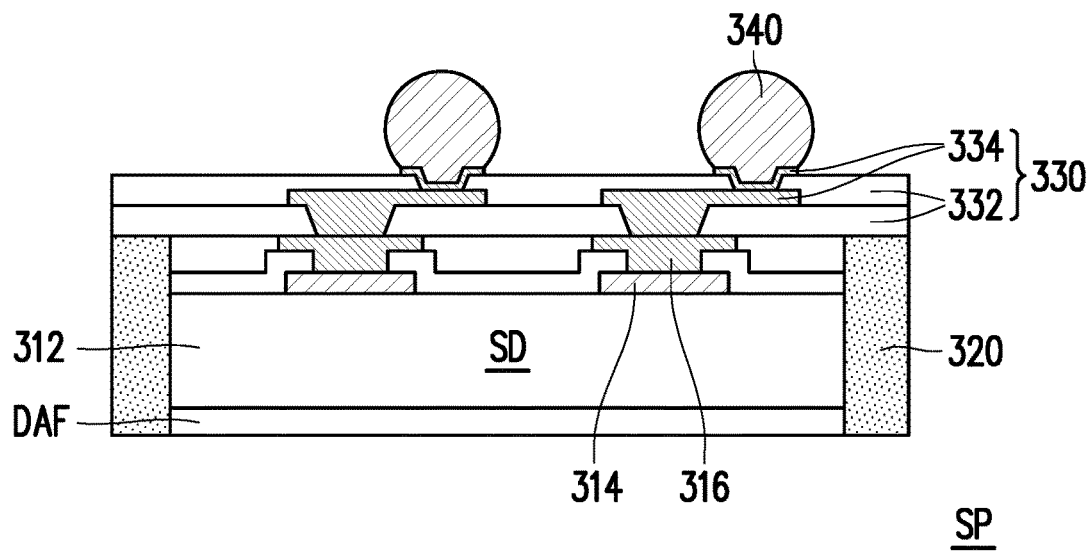

Referring to FIG. 1 and FIGS. 4E-4F, the method 100 proceeds to step 112 by singulating the resulting structure to form a plurality of semiconductor devices SP. For example, after forming the conductive terminals 340, the temporary carrier TC is de-bonded or removed from the resulting structure as shown in FIG. 4E. In some embodiments, the external energy such as UV laser, visible light or heat, is applied to the release layer to lose its adhesiveness, so that the insulating encapsulation 320 and the semiconductor die SD may be detached from the temporary carrier TC. FIG. 4E illustrates affixing the resulting structure on a tape frame TF that provides mechanical and structural support during subsequent singulation of the semiconductor device SP from adjacent ones. The resulting structure may be overturned to affix on the tape frame TF before or after de-bonding the temporary carrier TC. The die attach film DAF is optionally removed during or after removing the temporary carrier TC. The singulated structure is then removed from the tape frame TF, leaving the semiconductor device SP as shown in FIG. 4F. In some embodiments, the semiconductor device SP is referred to as a fan-out semiconductor package.

It should be noted that semiconductor device may take various forms. Additional processes may be provided before, during, and after processes described in FIG. 4A to FIG. 4F, and that some other processes may only be briefly described herein. In some embodiments, the semiconductor device SP may be electrically mounted onto a printed circuit board (PCB), a printed wiring board, interposer, package substrate, additional semiconductor package, and/or other carrier that is capable of carrying integrated circuits. Other packaging techniques may be used, which are not limited in the disclosure. The semiconductor device SP may be part of an electronic system for such as a computational device, a wireless communication device, a computer-related peripheral, an entertainment device, or the like. It should be noted that other applications are possible.

During fabrication of the semiconductor device SP, it is important to have proper alignment between the conductive connectors 316 of the semiconductor die SD and the patterned conductive layer 334 of the RDL 330. Improper alignment may result from various reasons during fabrication. For example, the semiconductor dies SD are shifted from the predetermined position on the temporary carrier TC during placement. In some embodiments, when curing the insulating material to form the insulating encapsulation 320, the insulating material deforms, and non-uniform stress may be applied to the individual semiconductor die SD to cause the semiconductor dies SD shift out of their original position after placement. When the semiconductor dies SD shift from one manufacturing process to a subsequent manufacturing process, patterns in the upper layer become misaligned to patterns in the lower layer. Such misalignment may lead to undesired electrical shorting in the semiconductor device SP because of misalignment of subsequent lithography process for forming the RDL 330 with respect to the shifted semiconductor dies. Improper alignment may become more and more problematic as alignment margins decrease due to increasing demand for the semiconductor dies SD having higher integration densities. There are many operating factors which may be taken into consideration for managing improper alignment as will be described below.

Figure 5:
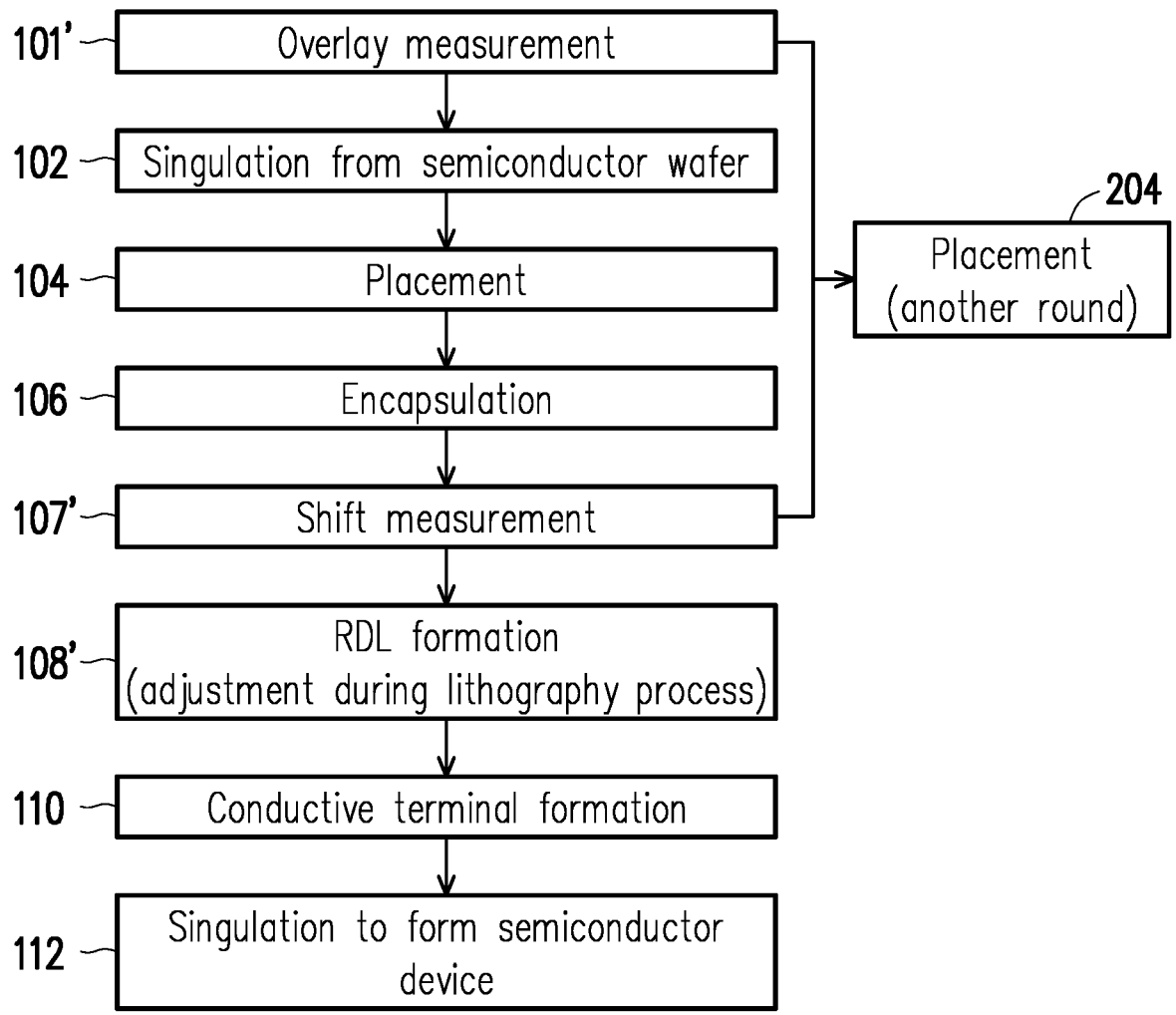
FIG. 5 is a flow diagram illustrating a manufacturing method of a semiconductor device according to some embodiments of the present disclosure.
Figures 6A, 6B:
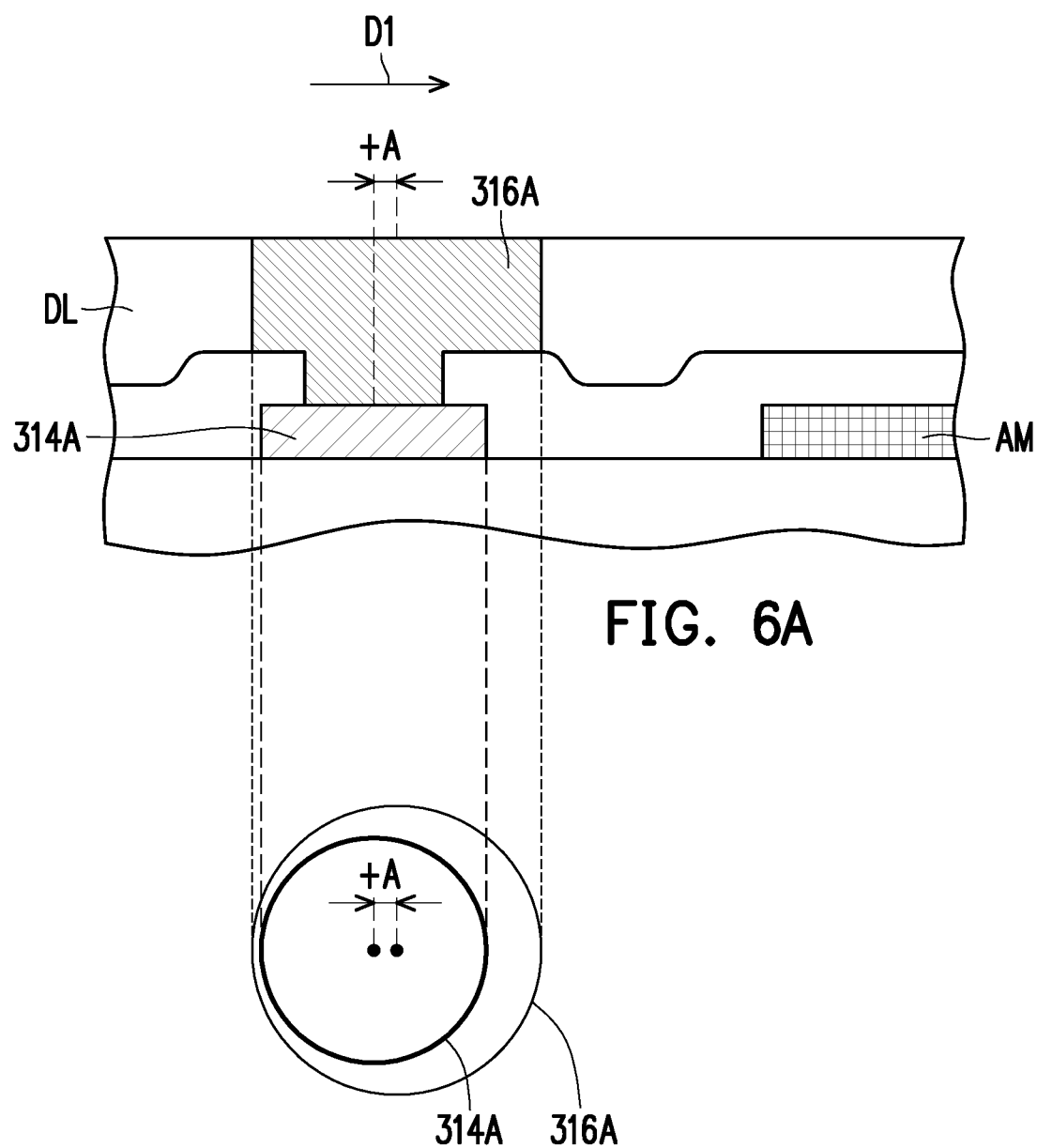
FIG. 6A and FIG. 7A are schematic cross-sectional views illustrating an overlay offset of a semiconductor die according to some embodiments of the present disclosure.
FIG. 6B and FIG. 7B are schematic top views illustrating the overlay offset of the semiconductor die respectively shown in FIG. 6A and FIG. 7A according to some embodiments of the present disclosure.
Figures 7A, 7B:
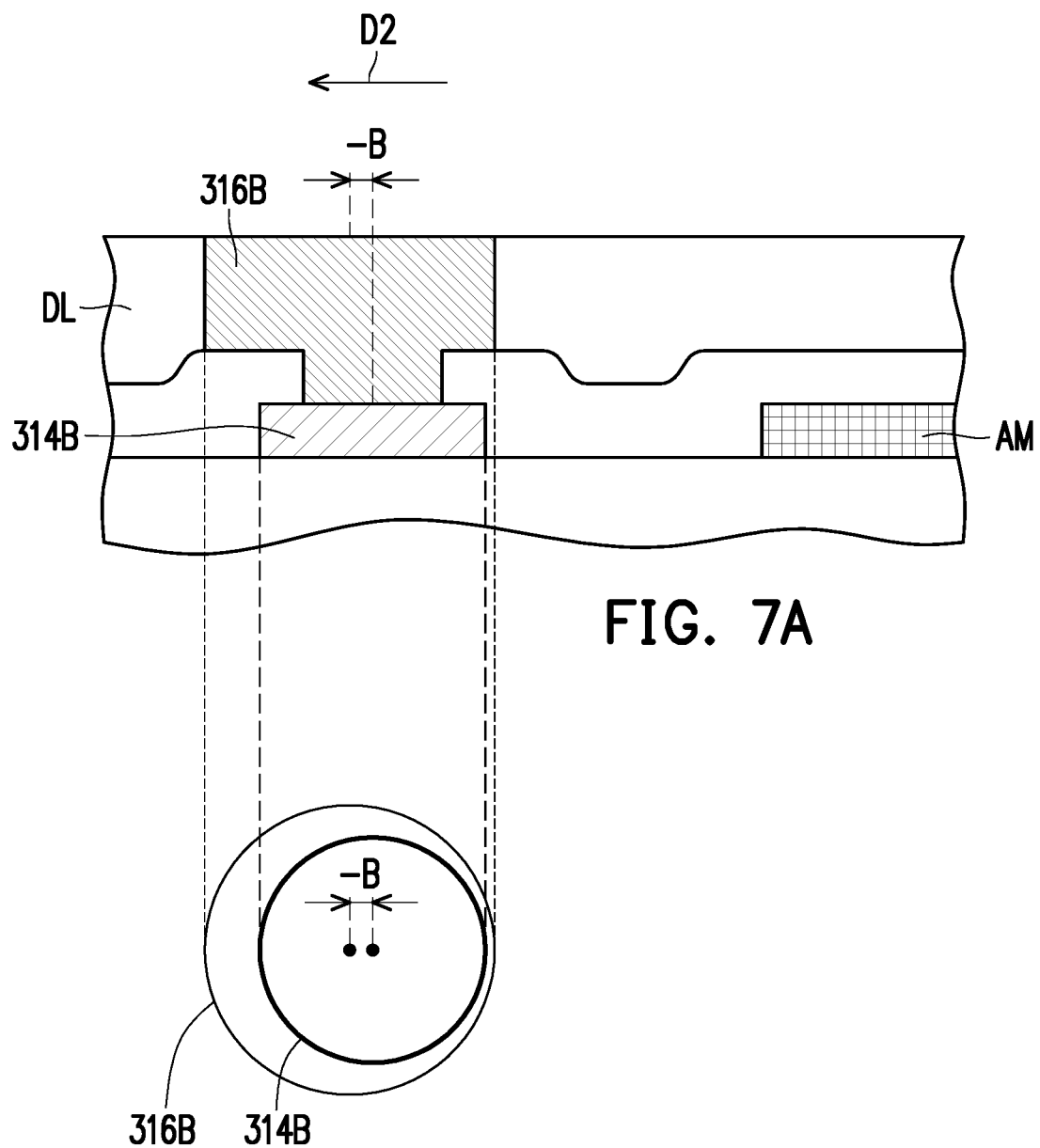
Figure 8:
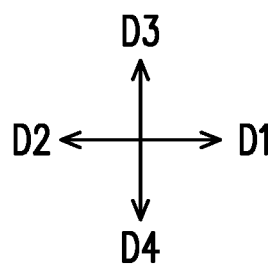
FIG. 8 is a schematic scatter chart illustrating overlay offset of semiconductor dies according to some embodiments of the present disclosure.
Figure 8:
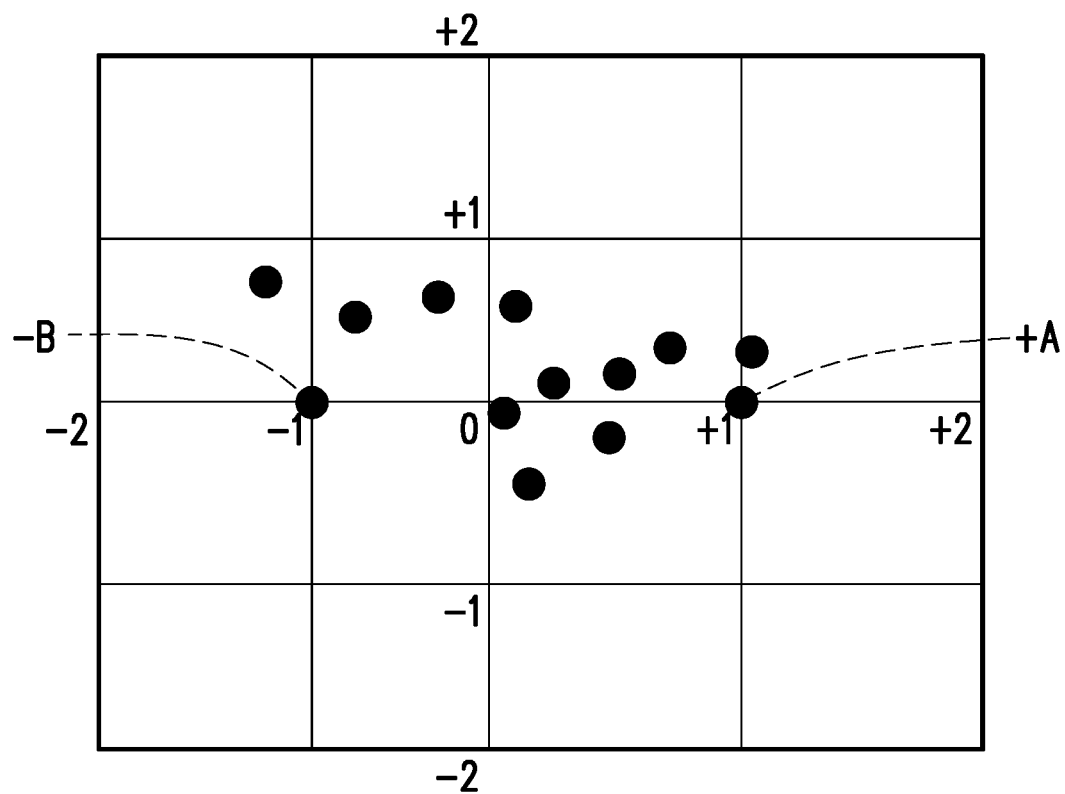
Figure 9:
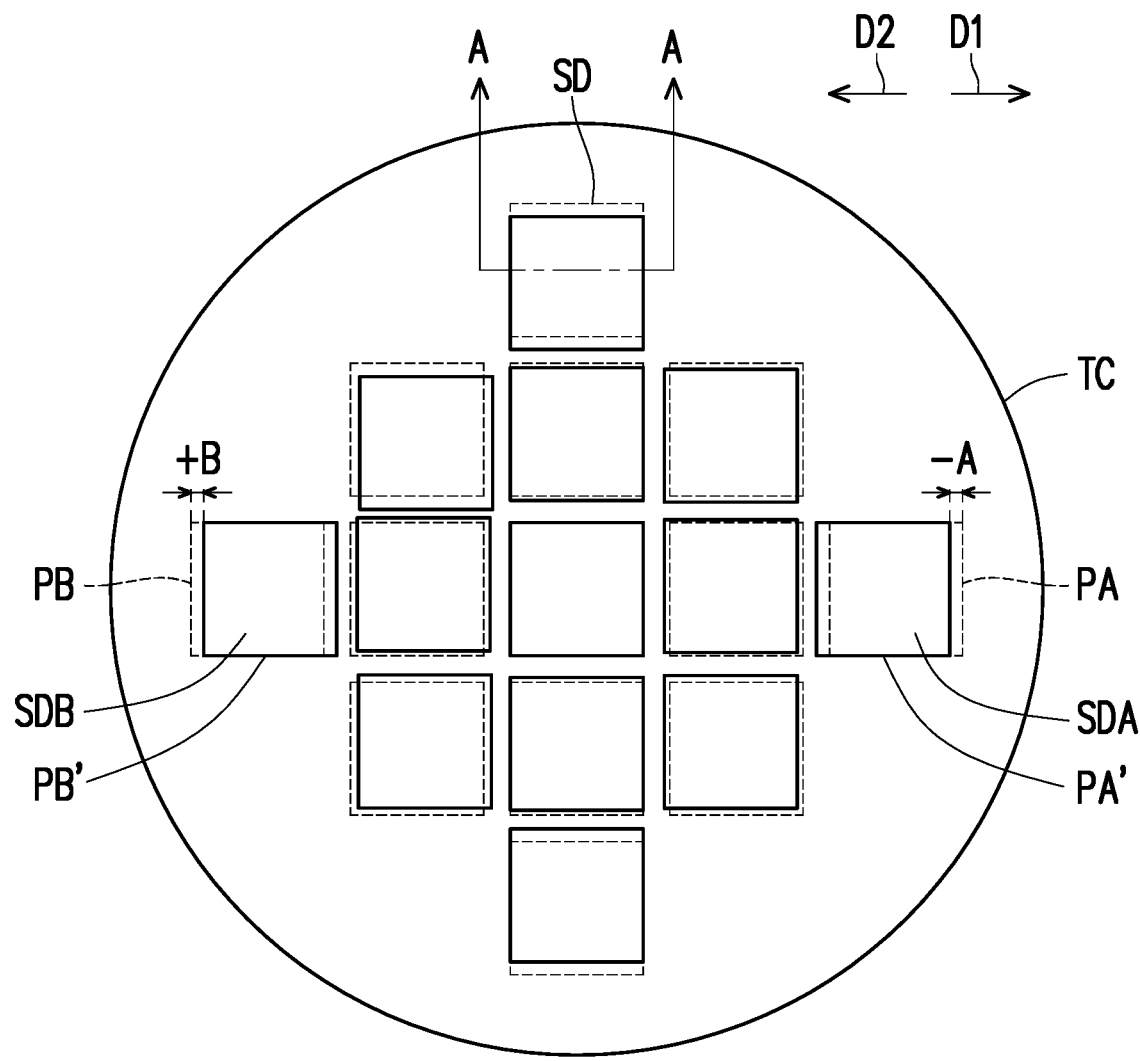
FIG. 9 is a schematic top view illustrating a plurality of semiconductor dies placed on a carrier after adjustment according to some embodiments of the present disclosure.
Figure 10:
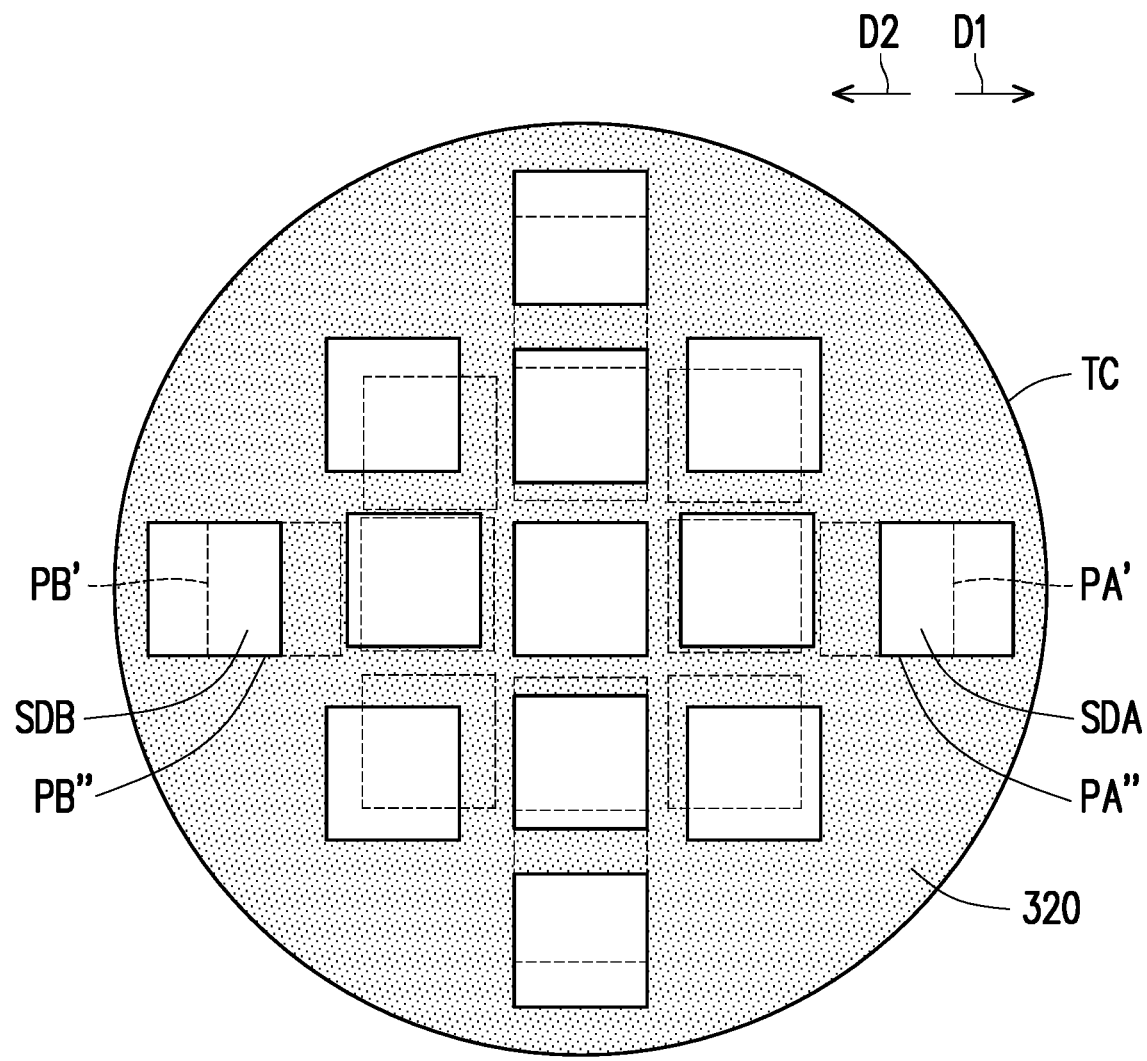
FIG. 10 is a schematic top view illustrating a distribution of semiconductor dies after encapsulation according to some embodiments of the present disclosure.
Figure 11A:
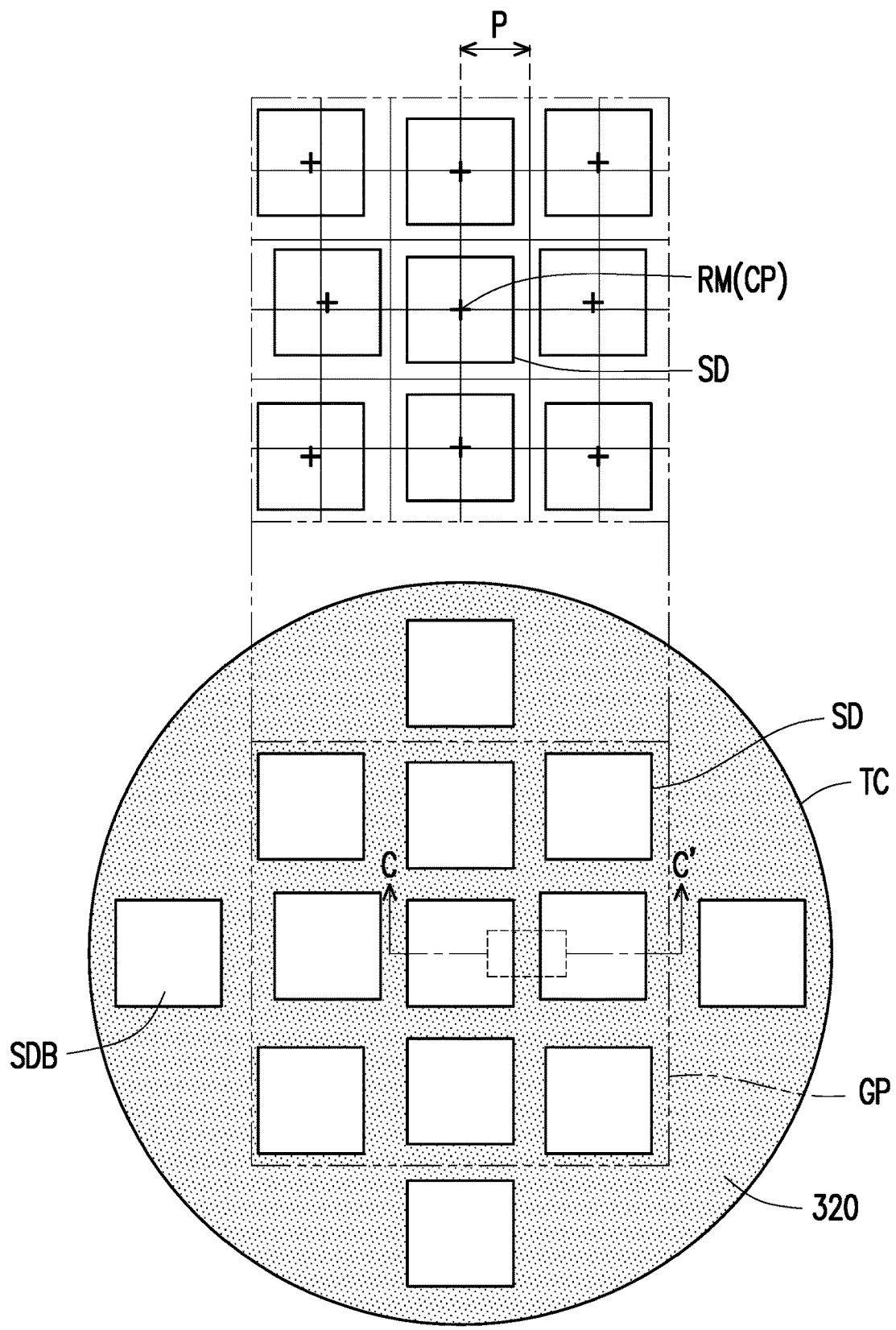
FIG. 11A is a schematic top view illustrating a distribution of semiconductor dies after encapsulation according to some embodiments of the present disclosure.
Figure 11B:
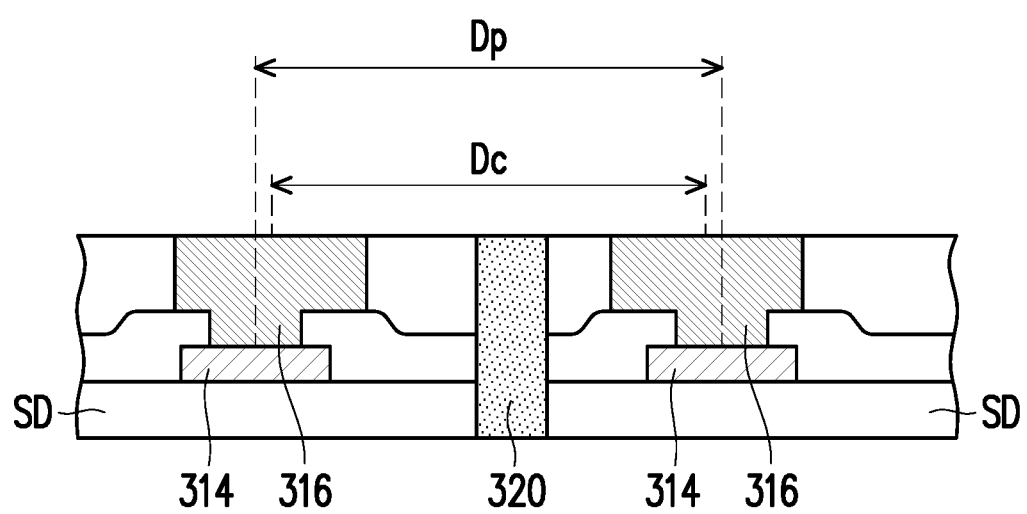
FIG. 11B is a schematic cross-sectional view illustrating partial semiconductor dies taken along line C-C' in FIG. 11A according to some embodiments.
Figure 12:
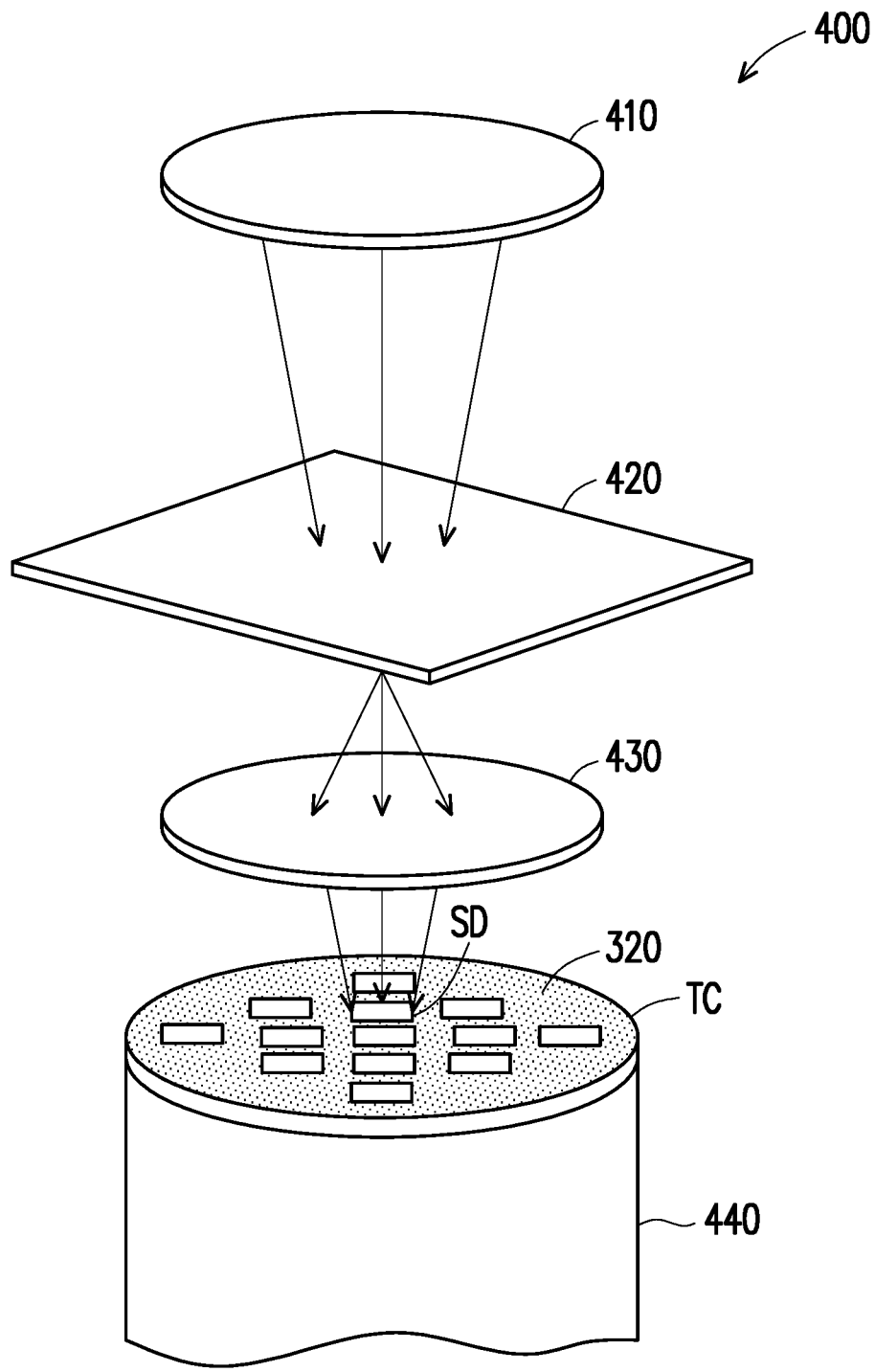
FIG. 12 is a schematic perspective view illustrating a lithography system for forming redistribution layer according to some embodiments of the present disclosure.

FIG. 5 is a flow diagram illustrating a manufacturing method of a semiconductor device, FIG. 6A and FIG. 7A are schematic cross-sectional views illustrating an overlay offset of a semiconductor die, where FIG. 6A and FIG. 7A may be the schematic cross-sectional views taken along line B-B' in FIG. 1, and FIG. 6B and FIG. 7B are schematic top views illustrating the overlay offset of the semiconductor die respectively shown in FIG. 6A and FIG. 7A, FIG. 8 is a schematic scatter chart illustrating overlay offset of semiconductor dies, FIG. 9 is a schematic top view illustrating a plurality of semiconductor dies placed on a carrier after adjustment, FIG. 10 and FIG. 11A are schematic top views illustrating a distribution of semiconductor dies after encapsulation, FIG. 11B is a schematic cross-sectional view illustrating partial semiconductor dies taken along line C-C' in FIG. 11A, and FIG. 12 is a schematic perspective view illustrating a lithography system for forming redistribution layer.

The semiconductor device and the method of making the same are collectively described with reference to FIG. 5 through FIG. 11B. It should be noted that some steps in FIG. 5 that are the same or similar to the steps described in FIG. 1 are indicated by the same or similar reference numerals, and the detailed descriptions are simplified for brevity. While the method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Referring to FIG. 5 through FIG. 8, the method 200 begins at step 101' by performing overlay measurement. For example, before performing singulation on the semiconductor wafer SW shown in FIG. 2, an overlay measuring process is performed with an overlay metrology apparatus (not shown) to determine an overlay offset between the conductive connector and corresponding conductive pad of the semiconductor die. For example, the overlay offset is the difference in position or misalignment of a target on one layer of the semiconductor wafer with another underlying target on another layer of the semiconductor wafer. For example, the overlay measurement is generated by image scanned performing by the overlay metrology apparatus. In some embodiments, the overlay metrology apparatus includes a scanning unit, a light source, and other suitable components for performing the overlay measurement. For example, the image of the semiconductor wafer is obtained by radiating or scanning the semiconductor wafer with the light source and determining an image (e.g., based on reflection of the radiation). In some embodiments, the scanning unit of the overlay metrology apparatus includes a camera operable to scan and generate the image. The step of generating the image may be performed once or several times for capturing images of different portions of the semiconductor wafer. It should be noted that the measurement of the overlay offset using the overlay metrology apparatus may be performed in various fashions which is not limited in the disclosure.

In some embodiments, the step 101' is adapted to provide measurement of overlay offset after completing the fabrication of the conductive connectors. For example, the measurement of overlay offset may be performed by comparing the first image having the distribution of the conductive pads and the second image having the distribution of the overlying conductive connectors, where a reference mark may be disposed on any layer of the semiconductor wafer for providing alignment of the first and the second images. Other metrology method may be employed to detect the overlay offset of the conductive pad and the corresponding conductive connector. In some embodiments, certain regions of die areas DL of the semiconductor wafer SW are chosen to measure the values representing the overlay offset of respective die area DL. For example, each die area DL includes more than one area on which a high-density distribution of conductive connectors are disposed, and such area may be viewed as the certain region for overlay measurement. It is noted that other featuring area(s) may be defined to be the certain region for overlay measurement.

In an embodiment, with reference to FIG. 2, FIG. 6A, and FIG. 6B, the overlay offset between successive layers of the die area DL of the semiconductor wafer SW is measured. For example, the die area DL of the semiconductor wafer SW includes the conductive connector 316A and the corresponding conductive pad 314A, where the conductive connector 316A is offset from the corresponding conductive pad 314A by an overlay offset value +A in a first direction D1. The overlay offset value +A may be the distance which includes the approximate distance from precise alignment of the conductive connector 316A and the corresponding conductive pad 314A. In some embodiments, the overlay offset value +A is measured from a certain point (e.g., center, midpoint of edge, end, vertex, etc.) of the conductive connector 316A to the corresponding point (e.g., center, midpoint of edge, end, vertex, etc.) of the conductive pad 314A. The offset direction may be based on the conductive pad 314A on which a certain point is set as the reference point.

In another embodiment, with reference to FIG. 2, FIG. 7A, and FIG. 7B, the die area DL of the semiconductor wafer SW includes the conductive connector 316B and the corresponding conductive pad 314B, where the conductive connector 316B is offset from the corresponding conductive pad 314B by an overlay offset value −B in a second direction D2 opposing to the first direction D1. The overlay offset value −B may be the distance which the conductive connector 316B is from being directly aligned with the corresponding conductive pad 314B. For example, a center of the conductive connector 316B is laterally offset from a center of the corresponding conductive pad 314B in the second direction D2.

For ease of description, and without intending the structures disclosed herein to be limited to any particular orientation, the first direction D1 and the second direction D2 are respectively, referred to herein for convenience as "right" and "left". In the illustrated embodiment in FIG. 6A and FIG. 6B, the conductive connector 316A is offset to the right of the corresponding conductive pad 314A. In the illustrated embodiment in FIG. 7A and FIG. 7B, the conductive connector 316B is offset to the left of the corresponding conductive pad 314B. It is noted that although two embodiments of overlay offset are illustrated, numerous other embodiments are possible including variations of overlay offset in different dimensional directions (e.g., first direction D1, second direction, D2, third direction D3, four direction D4, combination thereof, etc.). For example, in a top view, the conductive connector may be offset to, such as the bottom left hand side, the bottom right hand side, the top left hand side, the top right hand side, of corresponding conductive pad, where offset to the top and to the right are arbitrarily considered a positive value overlay offset, and offset to the bottom and to the left are arbitrarily considered a negative value overlay offset for the purpose of this disclosure.

In some embodiments, to ensure that successive layers are stacked correctly, reference mark AM may be used when fabricating the semiconductor wafer SW. For example, the overlay offset value (e.g., +A, −B) is determined by calculating a difference of relative position between the conductive connector (e.g., 316A, 316B) and the corresponding conductive pad (e.g., 314A, 314B) relative to the reference mark AM on the semiconductor wafer SW. In some embodiments, the reference mark AM is disposed at the same layer as the conductive pad 314A and serves as reference point to measure (or identify) the relative position of the conductive pad 314A. In some embodiments, the reference mark AM and the conductive pad 314A are formed during the same step, and may be made of the same or similar material(s). In some embodiments, the reference mark AM also serves as the reference point for the positional measurement of the conductive connector (e.g., 316A, 316B). In other embodiments, additional reference mark (not shown) may also be disposed at the same layer as the conductive connector and serves as reference point to measure (or identify) the relative position of the conductive connector, and the overlay offset between the conductive connector and the corresponding conductive pad may be measured via these reference marks. In some embodiments, the reference mark AM may be an optically readable mark or pattern formed on layers of the semiconductor wafer, and the scanning unit of the overlay metrology apparatus may be configured to scan the reference mark AM to identify the positions of the conductive pads and/or the conductive connectors. Other types and forms of the reference mark AM may be employed.

In some embodiments, numerous points regarding to the values of the overlay offset are plotted to generate the overlay offset profile. With reference to FIGS. 6A, 7A, and 8, for example, the overlay offset value (e.g., +A, −B) associated with each of the die area DL is shown in FIG. 8 as plotted points, where the overlay offset value (e.g., +A, −B) indicates how closely the conductive connector (e.g., 316A, 316B) aligned with the corresponding conductive pad (e.g., 314A, 314B). For example, the die area DL has the conductive pad 314A and the conductive connector 316A with 1 unit of overlay offset (i.e. +A) in the first direction D1 (plotted at "+1" in the coordinate system of FIG. 8). The die area DL may have the conductive pad 314B and the conductive connector 316B with 1 unit of overlay offset (i.e. −B) in the second direction D2 (plotted at "−1" in the coordinate system of FIG. 8). The plotted point (i.e. overlay offset value) may be considered as a dimensional value (or vector) which is used to indicate the degree of offset in a particular dimensional direction. These overlay offset values may be converted to the overlay correction values associated with corresponding semiconductor dies for subsequent placement step as will be described later.

The method 200 proceeds to step 102 by singulating the semiconductor wafer SW to form individual semiconductor die SD. After determining the overlay offset values corresponding to each die area DL, a cutting or singulation process may be performed along scribe lines to separate the die areas DL from one another, so that a plurality of semiconductor dies SD are formed. The singulation step is similar to the step 102 described in FIG. 1, so the detailed descriptions are omitted for brevity.

Referring to FIG. 5 and FIG. 9, the method 200 proceeds to step 104' by placing the semiconductor dies SD on the temporary carrier TC. In some embodiments, the overlay offset values (e.g., +A, −B) are used to determine the degree to which the positions of the semiconductor dies SD to be placed should be adjusted. For example, the overlay offset values (e.g., +A, −B) are converted to the overlay correction values (e.g., −A, +B), and then based on the overlay correction values (e.g., −A, +B), the pick-and-place tool and/or the wafer table (not shown) may adjust the positions of the semiconductor die to be placed accordingly.

In some embodiments, a host computing device (not shown) that controls an overlay metrology apparatus (not shown) outputs the overlay correction values (e.g., −A, +B which are converted from the overlay offset profile shown in FIG. 8), and the pick-and-place apparatus and/or the wafer table uses these overlay correction values output from the host computer to compensate for the expected overlay offset of each semiconductor die SD. The overlay correction value is the dimensional value which is used to position the semiconductor die at the modified position in corresponding dimensional direction. In some embodiments, during correction at the placement location, the wafer table or the pick-and-place tool is moved along the X-axis and/or Y-axis for a distance equal to the overlay correction values but in opposing direction of the overlay offset, to compensate for the overlay offset in the position of the semiconductor die.

In some embodiments, the semiconductor die SDA singulated from the semiconductor wafer SW has the conductive connector 316A offset from the conductive pad 314A in the first direction D1 (shown in FIG. 6A), then the semiconductor die SDA may be placed at the modified position PA' which is offset from the original position PA in the second direction D2 opposing to the first direction D1. The original position PA is an ideal position, for example, if the overlay correction value is zero, then the semiconductor die SDA is placed on the original position PA. The modified position PA' is a correction position for compensating the overlay offset of the semiconductor die SDA. For example, the semiconductor die SDA has the conductive connector 316A offset to the right from the conductive pad 314A by 1 unit, and then during placement, the overlay offset value +A is compensated by placing the semiconductor die SDA to the left by 1 unit of overlay correction (i.e. −A). Similarly, the semiconductor die SDB has the conductive connector 316B shifting to the left from the conductive pad 314B by 1 unit of overlay offset (e.g., −B), and thus the semiconductor die SDB may be placed at the modified position PB' which is offset to the opposing direction (i.e. to the right) from the original position PB by 1 unit of overlay correction (i.e. +B). It should be understood that the compensation method described above and the configuration shown in FIG. 9 are exemplary, and that variations thereof may be carried out while still remaining within the scope of the disclosure.

Referring to FIG. 5 and FIG. 10, the method 200 proceeds to step 106 by encapsulating the semiconductor dies (e.g., SDA, SDB) with an insulating encapsulation 320. For example, after placing the semiconductor dies (e.g., SDA, SDB) at the modified positions (e.g., PA', PB'), the insulating encapsulation 320 are formed on the temporary carrier TC to encapsulate the semiconductor dies (e.g., SDA, SDB). The forming process of the insulating encapsulation 320 may be similar to the process described in FIG. 4B, so the detailed descriptions are not repeated for brevity. As mentioned above, the semiconductor dies (e.g., SDA, SDB) may shift in placement on the temporary carrier TC during the encapsulation process (e.g., curing, cooling down, grinding, CMP, and/or other process). For example, the semiconductor die SDA is moved from the modified position PA' to the shifting position PA", and the semiconductor die SDB may be moved from the modified position PB' to the shifting position PB". It is found from experience that such positional shifting may not be uniform across the temporary carrier TC, which is a condition that may be undesirable to be compensated by a linear fashion in a subsequent process. In some embodiments, after encapsulation, the displacement of semiconductor dies behaves in the non-linear fashion. Accordingly, in a subsequent process, the correction parameters may be calculated to take into account non-linear variation of die shifting.

In some embodiments, one or more semiconductor dies SD are shifted away from the modified position (e.g., PA', PB') to the shifting position (e.g., PA", PB"). For example, the gap G (shown in FIG. 3) between the adjacent semiconductor dies SD changes before and after encapsulation. In some embodiments, after encapsulation, the gap between the adjacent semiconductor dies SD may be greater than the gap G before encapsulation. In some embodiments, a difference of the gap after and before encapsulation is various between different two of semiconductor die SD, and such difference may exhibit in a non-linear fashion. In some embodiments, the semiconductor dies SD may shift in different directions. In some embodiments, the semiconductor dies SD distal from the center of the die array on the temporary carrier TC may have a greater displacement than the semiconductor dies SD placed at the center or near the center of the die array on the temporary carrier TC. For example, the semiconductor dies SDA and SDB are disposed on the periphery in the die array on the temporary carrier TC and distal from each other, the shortest distance Dm between the modified positions PA' and PB' may be less than the shortest distance Ds between the shifting positions PA" and PB". FIG. 10 shows an example with the non-linear positional shifting after encapsulation process. It should be understood that the non-linear displacement illustrated in FIG. 10 is exemplary, and that variations thereof may be carried out while still remaining within the scope of the disclosure.

Referring to FIG. 5, FIG. 11A, and FIG. 11B, the method 200 proceeds to step 107' by performing shift measurement, where FIG. 11B may be a schematic cross-sectional view taken along line C-C' in FIG. 11A. For example, the overlay offset degree of the respective semiconductor die SD is measured after encapsulation process. In some embodiments, a shift metrology apparatus (not shown) is configured to perform the shift measurement by image scanning and/or detecting the reference marks of the semiconductor dies SD and determining the distance therebetween. For example, the shift metrology apparatus, similar to the overlay metrology apparatus, includes a scanning unit, a light source, a processer in communication with the scanning unit and the light source, and/or other suitable components for performing the shift measurement. In some embodiments, the image is obtained by radiating or scanning the target portion(s) of the semiconductor dies SD with the light source and determining the image. For example, the scanning unit of the shift metrology apparatus may include a camera operable to scan and generate the image of the target portion(s) which the camera is focused on. The step of generating the image may be performed once or several times for capturing images of different portions of the semiconductor dies SD over the temporary carrier TC. It should be noted that the shift measurement using the shift metrology apparatus may be performed in various fashions which is not limited in the disclosure.

For example, the processor of the shift metrology apparatus is configured to dividing the semiconductor dies SD several portions (e.g., GP outlined in two-dot-dashed line), and then a reference coordinate generated by the shift metrology apparatus may be set to correspond to the respective portion (e.g., GP). The origin of the reference coordinate may be aligned with a reference point of one of the semiconductor die SD in the selected portion GP so as to determine a relative displacement between the semiconductor dies SD in the selected portion GP. The degree of displacement for other semiconductor dies SD in the selected portion GP may be estimated based on the alignment of the one of the semiconductor die SD. In some embodiments, the reference coordinate may be constructed as a square grid having a given pitch P and may be mapped on the semiconductor dies SD of the selected portion (e.g., GP). For example, each of the semiconductor dies SD includes the reference mark RM, and the reference mark RM of one of the semiconductor dies SD located in the center of the selected portion GP is aligned with the center point CP of the square grid, so that the shifting value of the rest of semiconductor dies SD in the selected portion GP relative to the semiconductor dies SD positioned in the center may be identified or measured. The shifting value may be a dimensional value (or vector) which is used to indicate the degree of offset in a particular dimensional direction. It should be noted that the illustration in FIG. 11A is merely exemplary, and the origin of the reference coordinate (or the center of the grid) may be aligned with a reference mark on any one of the target semiconductor dies in the selected portions for measuring the relative displacement.

The reference marks may be or may include the conductive pads 314, the conductive connector 316, or the alignment marks disposed on the same level as the conductive connector 316 (described in FIG. 6A). Alternatively, the reference marks may be other reference marks (not shown) disposed elsewhere on the semiconductor dies or the temporary carrier TC may be used to measure the shifting values of the semiconductor dies. In some embodiments, the positions of the conductive pad 314 and/or the conductive connector 316 may be estimated by identifying the position of the reference mark, so that the relative displacement between semiconductor dies SD may be further estimated by calculating the distance Dp between certain points (e.g., center, midpoint of edge, end, vertex, etc.) of the conductive pads 314 or calculating the distance Dc between certain points of the conductive connectors 316. In some embodiments, the relative displacement is determined by identifying the position of the target conductive connector 316 of the respective semiconductor die SD in the selected portion GP, and by means of setting one of the semiconductor dies SD in the selected portion GP as a reference point, the shifting value of the other semiconductor dies SD in the selected portion GP relative to the reference point may be estimated. In some embodiments, the shifts between the semiconductor dies SD over the temporary carrier TC exhibit a non-linear dimensional change. Alternatively, step 107' is skipped, and the shift of the respective semiconductor die may be identified during the subsequent step.

Referring to FIG. 5 and FIG. 12, the method 200 proceeds to step 108' by forming the RDL 330 on the semiconductor dies SD and the insulating encapsulation 320. The RDL 330 may include the patterned dielectric layer 332 with the patterned conductive layer 334 formed therein and on the top surface thereof. The patterned conductive layer 334 may provide fan-out of conductive connectors 316 of the semiconductor dies SD (see FIG. 4C, for example). In some embodiments, the patterned dielectric layer 332 is formed with openings using lithography and etching process, whereby a photoresist is deposited and patterned and then used as a mask during an etching process in order to remove portions of the dielectric material and expose portions of the underlying conductive connectors 316. In some embodiments, the patterned conductive layer 334 is formed by depositing a seed layer conformally on the patterned dielectric layer 332, forming a photoresist material layer over the seed layer, baking the photoresist material layer, performing lithography on the photoresist layer to form openings on the photoresist material layer, plating conductive materials in the openings of the photoresist material layer, removing the photoresist material layer and the excess seed layer. Accordingly, lithography (i.e., exposure and development processes) process may be performed several times during formation of the RDL 330.

In some embodiments, the step of forming the RDL 330 may be viewed as forming the lithographic pattern(s) at least on the semiconductor die SD with a lithographic tool 400. In some embodiments, after measuring the shift in the position of the semiconductor dies to generate a measuring result, the measuring result may be fed back to a lithographic tool utilized to form the RDL 330. Various methods may be used to compensate for the shifting value by adjusting process correction parameters involved in the lithography operation.

An exemplary lithographic tool 400 including an illumination unit 410, a photomask (also referred to as a mask or a reticle) 420, a projection unit 430 is shown in FIG. 12. It should be noted that the components in FIG. 12 are shown in a simplified manner, and the lithographic tool 400 may include other techniques and/or components. For example, the illumination unit 410 includes a light source (e.g., UV source, deep UV source, extreme UV source, and X-ray source, electron beam (E-Beam) source, ion beam source, etc.), an optical assembly (e.g., lens, shadow masks, etc.), and/or other suitable components. The temporary carrier TC carries the semiconductor dies SD packaged in the insulating encapsulation 320 are disposed on the wafer table 440 which is configured to secure and move the temporary carrier TC in translational and/or rotational manners so as to align the semiconductor dies SD with the photomask 420. In some embodiments, the photomask 420 includes a transparent substrate and a patterned absorption layer, where the patterned absorption layer may have one or more openings through which a light beam may travel through. Alternatively, the photomask 420 may be a reflective mask. The projection unit 430 may include magnification lens, refractive optics, or reflective optics to guide the patterned light to a target semiconductor die. During a lithography exposure process, the target semiconductor die SD may be exposed to a pattern (not shown) on the photomask 420 to transfer the pattern of the photomask 420 onto the target semiconductor die SD on which the photoresist material is deposited.

Various methods may be used to compensate for the shifting value between semiconductor dies SD before, during, or after exposure. In certain embodiments, the wafer table 440 provides compensated movement of the temporary carrier TC in X, Y, and/or Z direction(s) during various operations (e.g., alignment, focus, leveling, exposure, etc.) in the lithographic tool 400 so that the pattern of the photomask 420 is transferred onto the target semiconductor die SD accurately. In other embodiments, the photomask 420 is stepped on the semiconductor dies SD carried by the wafer table 440 by a stepping machine (not shown), and the photomask 420 is stepped by a step distance for each exposure. In some embodiments, the value for the step distance varies depending upon the shifting value and other factor(s). Alternatively, the illumination unit 410 and/or the projection unit 430 may perform the adjustment to correct or compensate for shifting between semiconductor dies SD. Other process variables of the lithographic tool 400 may be adjusted in response to the overlay correction value and/or the shifting value to achieve better accuracy.

In certain embodiments in which the step 107' is skipped, the displacement of each semiconductor die resulting from the encapsulation step may be identified die by die during the lithography operation, and then the lithography tool is adjusted to compensate for the displacement of the respective semiconductor die. The shift measurement and the compensation for the shifting value may reduce adversely effect on the formation of each successive layer, and the shifting compensation during the exposure operation may be desirable for reducing time-consuming rework.

The method 200 then continues to step 110 followed by step 112 by forming conductive terminals 340 on the RDL 330 and singulating the resulting structure to form a plurality of semiconductor devices SP. FIG. 4D through FIG. 4F illustrate cross-sectional views of some embodiments corresponding to step 110 and step 112. The processes of forming conductive terminals 340 and singulation may be similar to those processes described above, so the detailed descriptions are not repeated for brevity.

Continue to FIG. 5, the method 200 proceeds to step 204, where another round of die placement is performed. In some embodiments, the operating method includes a feedback correction to subsequent semiconductor dies processed by the same process (e.g., die placement). For example, the host computing device is coupled to the overlay metrology apparatus and/or the shift metrology apparatus. The overlay offset data collected at the step 101' (i.e. overlay measurement) and/or the shifting data collected at the step 107' (i.e. shift measurement) may be transmitted to the host computing device, and the host computing device may be configured to process the overlay offset data and the shifting data and may be in communicate with the processing tool for adjusting process variables. Based on the overlay offset data and/or the shifting data, process recipes may be adjusted and/or other changes may be made for the next round of fabricating semiconductor devices.

For example, when disposed the semiconductor dies on the temporary carrier (e.g., step 104 or 104') in another round of fabricating semiconductor devices, the feedback correction is performed in response to the overlay measurement (performed in present round) and the shift measurement (performed in previous round) to determine the compensated value for the position of respective semiconductor die. In some embodiments, the method 200 shown in FIG. 5 may be performed multiple times as pilot samples to collect sample data, so that the host computing device may determine the appropriate compensated value for positions of various semiconductor dies based on the sample data. In some embodiments, when obtaining a sufficient amount of sample data, the operating method may automatically perform the adjustment to correct die-shifting issue, thereby reducing labor requirement.

The semiconductor device SP may achieve better shift control by taking the overlay offset of respective semiconductor die and the shift of respective packaged semiconductor die into account during fabrication. For example, the shifting control value (mean plus standard deviation) is greater than 10 μm if the overlay offset values and the shifting values are not taken into consideration. In certain embodiments in which both of the overlay offset value and the shifting value are compensated during processing, the shifting control value is controlled to less than 5 μm, for example, in a range of about 3 μm and about 5 μm. Such improvement may meet the increasing demand for semiconductor devices having higher integration densities according to some embodiments. It should be noted that the overlay measurement and/or the shift measurement may be applied to other type(s) of packaging technology, and the process stages shown in FIG. 4A to FIG. 4F are merely an exemplary embodiment.

Figure 13:
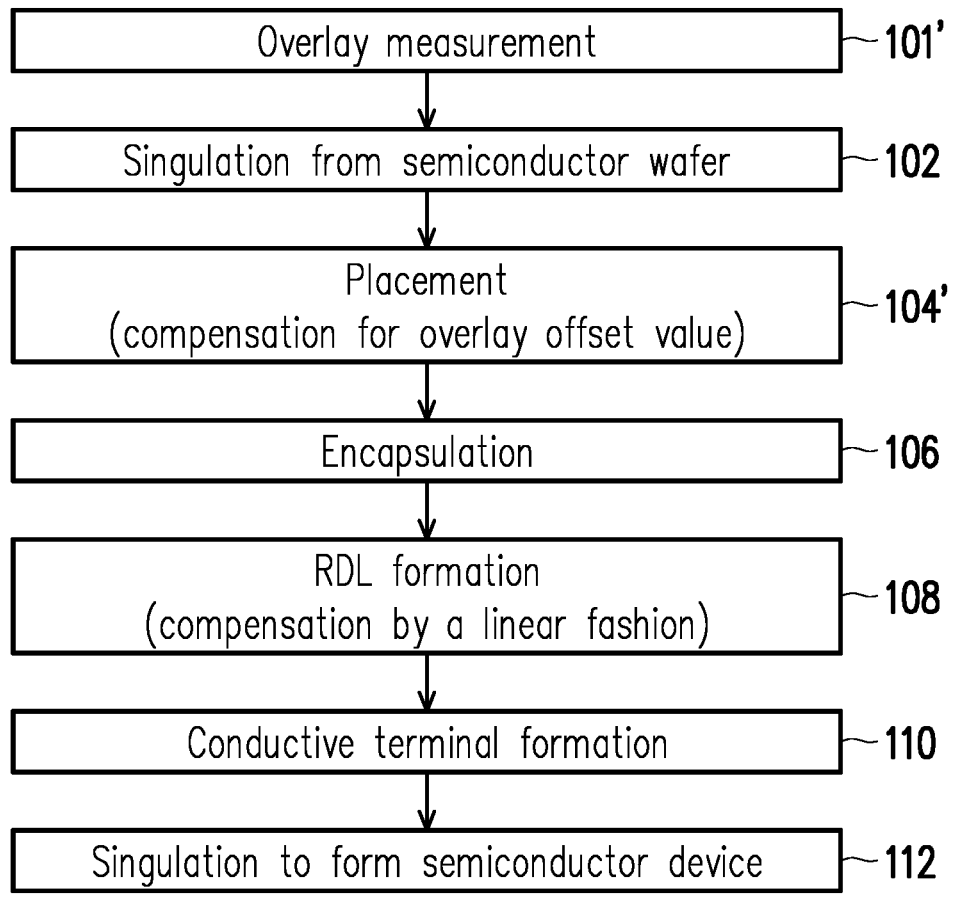
FIG. 13 and FIG. 14 are flow diagrams illustrating manufacturing methods of a semiconductor device according to some embodiments of the present disclosure.
Figure 14:
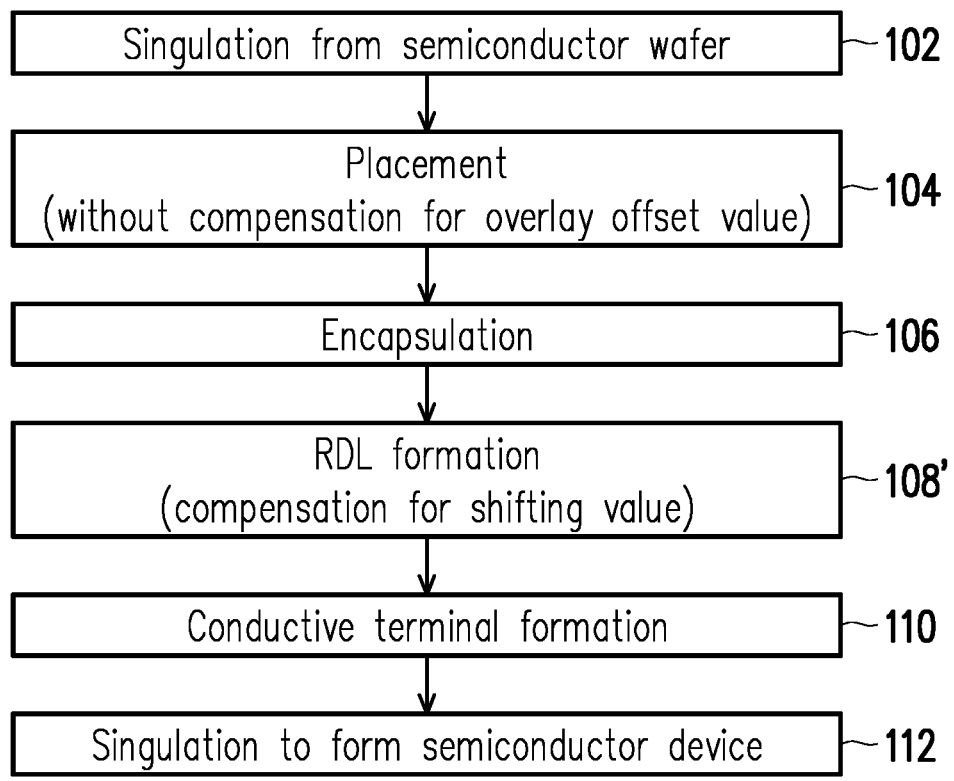

FIG. 13 and FIG. 14 are flow diagrams illustrating manufacturing methods of a semiconductor device according to some embodiments of the present disclosure. It should be noted that some steps in FIG. 13 and FIG. 14 that are the same or similar to the steps described in FIG. 1 and FIG. 5 are indicated by the same or similar reference numerals, so the detailed descriptions are omitted for brevity. While the methods 500 and 600 are respectively illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Referring to FIG. 13, in some embodiments, the method 500 begins at step 101' by performing overlay measurement, where an exemplary implementation of this step is described above. Next, the method 500 proceeds to step 102 by singulating the semiconductor wafer to form individual semiconductor die. Next, the method 500 proceeds to step 104' by placing the semiconductor dies on the temporary carrier with compensating for the overlay offset value for respective semiconductor die, and then to step 106 by encapsulating the semiconductor dies with an insulating encapsulation. Next, the method 500 proceeds to step 108 by forming the RDL on the semiconductor dies and the insulating encapsulation, where although the displacement of semiconductor dies behaves in the non-linear fashion after encapsulation, the displacement of semiconductor dies is compensated by a linear fashion during lithography process of forming the RDL. In some embodiments, process(es) variable of the lithographic tool is adjusted to compensate for the overlay offset determined during the overlay measurement step, for example, adjusting the position of the photomask, moving the wafer table on which the temporary carrier is disposed, or the like. Subsequently, the method 500 proceeds to step 110 followed by step 112 by forming conductive terminals on the RDL and then singulating the resulting structure to form a plurality of semiconductor devices. The semiconductor device fabricated using the method 500 may achieve a certain degree of shift control. For example, the shifting control value is controlled to less than 10 μm, for example, in a range of about 7 μm and about 10 μm.

Referring to FIG. 14, the method 600 begins at step 102 by singulating the semiconductor wafer to form individual semiconductor die. Next, the method 600 proceeds to step 104 and step 106 by placing the semiconductor dies on the temporary carrier and encapsulating the semiconductor dies with an insulating encapsulation. Next, the method 600 proceeds to step 108' by forming the RDL on the semiconductor dies and the insulating encapsulation. At this step, the displacement of semiconductor dies may be compensated for the shifting value for respective semiconductor die during lithography process of forming the RDL, where the shifting value may be the actual shifting value which is obtained by performing the shift measurement (as described in step 107' of FIG. 5), or may be the estimated shifting value which is determined by previously collected data in pilot samples. Subsequently, the method 600 proceeds to step 110 followed by step 112 by forming conductive terminals on the RDL and then singulating the resulting structure to form a plurality of semiconductor devices. The semiconductor device fabricated using the method 600 may achieve a certain degree of shift control. For example, the shifting control value is controlled to less than 10 μm, for example, in a range of about 5 μm and about 7 μm.

According to some embodiments, a shift control method in manufacture of semiconductor device includes at least the following step. A plurality of semiconductor dies is encapsulated with an insulating encapsulation over a carrier, where at least portions of the plurality of semiconductor dies are shifted after encapsulating. A lithographic pattern is formed at least on the plurality of semiconductor die, where forming the lithographic pattern includes compensating for a shift in a position of the portions of the plurality of semiconductor dies.

According to some alternative embodiments, a shift control method in manufacture of semiconductor device includes at least the following step. A plurality of semiconductor dies is placed on a carrier. An insulating encapsulation is formed on the carrier to cover the plurality of semiconductor dies. A shift measurement is performed on the plurality of semiconductor dies after forming the insulating encapsulation. A redistribution structure is formed on the plurality of semiconductor die and the insulating encapsulation, where a shifting feedback correction is performed in response to the shift measurement when forming the redistribution structure.

According to some alternative embodiments, a shift control method in manufacture of semiconductor device includes at least the following step. A plurality of semiconductor dies is placed at first positions over a carrier in response to an overlay offset of the respective semiconductor die. An insulating encapsulation is formed on the carrier to encapsulate the plurality of semiconductor dies, where a portion of the plurality of semiconductor dies is shifted from the first positions to second positions. The plurality of semiconductor dies are post processed to form a semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shift control method in manufacture of semiconductor device, comprising:
   placing a plurality of semiconductor dies over a carrier, wherein an overlay offset is between a first target of one of the plurality of semiconductor dies and a second target of the one of the plurality of semiconductor dies, the first target and the second target are stacked upon one another, and the overlay offset is compensated when placing the one of the plurality of semiconductor dies over the carrier;
   encapsulating the plurality of semiconductor dies with an insulating encapsulation over the carrier, wherein at least portions of the plurality of semiconductor dies are shifted after encapsulating; and
   forming a lithographic pattern at least on the plurality of semiconductor dies, wherein forming the lithographic pattern comprises compensating for a shift in a position of the portions of the plurality of semiconductor dies.

2. The shift control method in manufacture of semiconductor device of claim 1, further comprising:
   measuring the shift in the position of the portions of the plurality of semiconductor dies to result in a measuring result before forming the lithographic pattern; and
   feeding back the measuring result to a lithographic tool utilized to form the lithographic pattern.

3. The shift control method in manufacture of semiconductor device of claim 2, wherein measuring the shift in the position of the portions of the plurality of semiconductor dies comprises:
   setting a reference coordinate to map the portions of the plurality of semiconductor dies, wherein an origin of the reference coordinate is aligned with one of the portions of the plurality of semiconductor dies.

4. The shift control method in manufacture of semiconductor device of claim 1, further comprising:
   scanning a semiconductor wafer to capture an image of the semiconductor wafer; and
   performing a singulation process on the semiconductor wafer to form the plurality of semiconductor dies before placing the plurality of semiconductor dies over the carrier.

5. The shift control method in manufacture of semiconductor device of claim 1, further comprising:
   measuring the overlay offset of the one of the plurality of semiconductor dies before singulating the one of the plurality of semiconductor dies from a semiconductor wafer.

6. The shift control method in manufacture of semiconductor device of claim 5, wherein:
   the first target is a conductive pad of the one of the plurality of semiconductor dies, and the second target is a conductive connector of the one of the plurality of semiconductor dies disposed on the conductive pad, and
   measuring the overlay offset comprises calculating a difference of relative position between the conductive connector and the conductive pad relative to a reference mark on the one of the plurality of semiconductor dies.

7. The shift control method in manufacture of semiconductor device of claim 1, further comprising:
   releasing the carrier; and
   performing a singulation process to cut through the insulating encapsulation and the redistribution structure underlying the insulating encapsulation.

8. A shift control method in manufacture of semiconductor device, comprising:
   performing an overlay measurement on a plurality of die regions of a semiconductor wafer, wherein each of the plurality of die regions comprises a conductive pad and a conductive connector formed on the conductive pad;
   performing a singulation process on the semiconductor wafer to form a plurality of semiconductor die;
   placing the plurality of semiconductor dies on a carrier, wherein placing the plurality of semiconductor dies on the carrier comprises performing an overlay feedback correction in response to the overlay measurement;
   forming an insulating encapsulation on the carrier to cover the plurality of semiconductor dies;
   performing a shift measurement on the plurality of semiconductor dies after forming the insulating encapsulation; and
   forming a redistribution structure on the plurality of semiconductor dies and the insulating encapsulation, wherein a shifting feedback correction is performed in response to the shift measurement when forming the redistribution structure.

9. The shift control method in manufacture of semiconductor device of claim 8, wherein performing the overlay measurement comprises:
   scanning the semiconductor wafer to capture an image of the semiconductor wafer.

10. The shift control method in manufacture of semiconductor device of claim 8, wherein performing the overlay measurement comprises:
    calculating a difference of relative position between the conductive connector and the conductive pad relative to a reference mark on one of the plurality of semiconductor dies.

11. The shift control method in manufacture of semiconductor device of claim 8, wherein forming the insulating encapsulation comprises:
    performing a molding process to encapsulate the plurality of semiconductor dies with an insulating material;
    curing the insulating material, wherein during the curing, the plurality of semiconductor dies are shifted from first position to second positions; and
    planarizing the insulating material to form the insulating encapsulation laterally covering the plurality of semiconductor dies.

12. The shift control method in manufacture of semiconductor device of claim 8, wherein performing the shift measurement comprises:
    setting one of the plurality of the semiconductor dies as a reference point; and
    determining a relative displacement of the plurality of the semiconductor dies relative to the reference point.

13. The shift control method in manufacture of semiconductor device of claim 8, wherein forming the redistribution structure comprises:
    performing a lithography process to form a dielectric layer with openings on the plurality of the semiconductor dies and the insulating encapsulation, wherein the openings of the dielectric layer accessibly expose at least a portion of conductive connectors of the plurality of the semiconductor dies, and the shifting feedback correction is performed when performing the lithography process.

14. The shift control method in manufacture of semiconductor device of claim 8, further comprising:
- releasing the carrier; and
- performing another singulation process to cut through the insulating encapsulation and the redistribution structure underlying the insulating encapsulation.

15. A shift control method in manufacture of semiconductor device, comprising:
- placing a plurality of semiconductor dies at first positions over a carrier in response to an overlay offset of the respective semiconductor die, wherein before placing one of the plurality of semiconductor dies, measuring a degree of offset of a conductive connector of the one of the plurality of semiconductor dies from a conductive pad of the one of the plurality of semiconductor dies, and the conductive connector is stacked upon the conductive pad;
- forming an insulating encapsulation on the carrier to encapsulate the plurality of semiconductor dies, wherein a portion of the plurality of semiconductor dies is shifted from the first positions to second positions; and
- post processing the plurality of semiconductor dies to form a semiconductor device.

16. The shift control method in manufacture of semiconductor device of claim 15, wherein forming the insulating encapsulation on the carrier to encapsulate the plurality of semiconductor dies comprises:
- performing a molding process to encapsulate the plurality of semiconductor dies with an insulating material;
- curing the insulating material, wherein during the curing, the portion of the plurality of semiconductor dies is shifted from the first positions to the second positions; and
- planarizing the insulating material to form the insulating encapsulation.

17. The shift control method in manufacture of semiconductor device of claim 15, wherein placing the one of the plurality of semiconductor dies comprises:
- positioning the one of the plurality of semiconductor dies at the first position to compensate for the degree of offset of the conductive connector from the conductive pad.

18. The shift control method in manufacture of semiconductor device of claim 15, further comprising:
- measuring a shift of the portion of the plurality of semiconductor dies after forming the insulating encapsulation.

19. The shift control method in manufacture of semiconductor device of claim 18, wherein measuring the shift of the portion of the plurality of semiconductor dies comprises:
- aligning one of the plurality of semiconductor dies with an origin of a reference coordinate, wherein the reference coordinate is mapped on the portion of the plurality of semiconductor dies; and
- determining a relative displacement between other ones of the portion of the plurality of semiconductor dies relative to the one of the plurality of semiconductor dies.

20. The shift control method in manufacture of semiconductor device of claim 18, wherein post processing the plurality of semiconductor dies comprises:
- forming a lithographic pattern on the portion of the plurality of semiconductor dies in response to the shift of the portion of the plurality of semiconductor dies.

\* \* \* \* \*